United States Patent
Ananthanarayanan et al.

(10) Patent No.: US 11,489,620 B1
(45) Date of Patent: Nov. 1, 2022

(54) LOSS RECOVERY USING STREAMING CODES IN FORWARD ERROR CORRECTION

(71) Applicant: Microsoft Technology Licensing, LLC, Redmond, WA (US)

(72) Inventors: Ganesh Ananthanarayanan, Seattle, WA (US); Yu Yan, Kirkland, WA (US); Martin Ellis, Pittsburgh, PA (US); Michael Harrison Rudow, Pittsburgh, PA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/480,917

(22) Filed: Sep. 21, 2021

Related U.S. Application Data

(60) Provisional application No. 63/208,718, filed on Jun. 9, 2021.

(51) Int. Cl.
H04L 1/00 (2006.01)

(52) U.S. Cl.
CPC .................... H04L 1/004 (2013.01)

(58) Field of Classification Search
CPC ..... H04L 1/004; H04L 1/0041; H04L 1/0042; H04L 1/0045; H04L 1/0047; H04L 1/0036
See application file for complete search history.

(56) References Cited

U.S. PATENT DOCUMENTS

| | | | |
|---|---|---|---|
| 2013/0039410 A1* | 2/2013 | Tan | H04N 19/895 375/240 |
| 2013/0156420 A1* | 6/2013 | Amitai | H04L 1/0009 398/27 |
| 2017/0279558 A1 | 9/2017 | Badr et al. | |
| 2019/0007069 A1* | 1/2019 | Caramma | H04L 65/65 |
| 2019/0339997 A1 | 11/2019 | Momchilov | |

(Continued)

OTHER PUBLICATIONS

"ITU-T G. 1010: End-User Multimedia Qos Categories", In Journal of G Series: Transmission Systems and Media, Digital System and Networks-Multimedia Quality of Service and Performance Generic and User-Related Aspects, Nov. 2001, 16 Pages.

(Continued)

*Primary Examiner* — Christine T. Tu
(74) *Attorney, Agent, or Firm* — ArentFox Schiff LLP

(57) ABSTRACT

Identifying, by a sender and for each frame i of a plurality of frames of a video stream, a partition of a set of video data symbols D[i] into a first set of video data symbols U[i] and a second set of video data symbols V[i]. Generating, by the sender and for each frame i, a set of one or more streaming forward error correction (FEC) code parity symbols P[i] based on the symbols: V[i–τ] through V[i–1], U[i–τ], and the symbols D[i], wherein τ is a function of a maximum tolerable latency of the video stream expressed as a whole number of frames. Encoding, by the sender and for each frame i, packets carrying the symbols D[i], and P[i]. Transmitting, by the sender, each frame i of encoded packets in frame order to one or more receivers.

20 Claims, 13 Drawing Sheets

(56) References Cited

U.S. PATENT DOCUMENTS

2020/0044772 A1* 2/2020 Low .................. H04L 47/33

OTHER PUBLICATIONS

Adler, "Burst-Erasure Correcting Codes with Optimal Average Delay", In Journal of IEEE Transactions on Information Theory, vol. 63, No. 5, Jun. 2016, 23 Pages.

Badr, et al., "Diversity Embedded Streaming Erasure Codes (DeSco): Constructions and Optimality", In IEEE Journal on Selected Areas in Communications, vol. 29, No. 5, May 2011, 12 Pages.

Badr, et al., "FEC for VoIP using Dual-Delay Streaming Codes", In Proceedings of INFOCOM-IEEE Conference on Computer Communications, May 1, 2017, 9 Pages.

Badr, et al., "Layered Constructions for Low-Delay Streaming Codes", In Journal of IEEE Transactions on Information Theory, vol. 63, No. 1, Jan. 2017, pp. 111-141.

Badr, et al., "Multiplexed Coding for Multiple Streams with Different Decoding Delays", In Journal of IEEE Transactions on Information Theory, vol. 64, Issue-6, Jun. 2018, pp. 4365-4378.

Badr, et al., "Perfecting Protection for Interactive Multimedia: A Survey of Forward Error Correction for Low-Delay Interactive Applications", In Journal of IEEE Signal Processing Magazine, vol. 34, Issue-2, Mar. 3, 2017, 40 Pages.

Badr, et al., "Streaming Codes for Multicast Over Burst Erasure Channels", In Journal of IEEE Transactions on Information Theory, vol. 61, No. 8, Aug. 2015, 46 Pages.

Badr, et al., "Streaming Codes with Partial Recovery Over Channels with Burst and Isolated Erasures", In IEEE Journal of Selected Topics in Signal Processing, vol. 9, No. 3, Apr. 2015, pp. 501-516.

Bandung, et al., "QoS Analysis for WebRTC Videoconference on Bandwidth-Limited Network", In Proceedings of 20th International Symposium on Wireless Personal Multimedia Communications (WPMC), Dec. 17, 2017, pp. 547-553.

Begen, "RTP Payload Format for 1-D Interleaved Parity Forward Error Correction (FEC)", Retrieved From: https://www.hjp.at/doc/rfc/rfc6015.html, Oct. 2010, 32 Pages.

Cutler, et al., "Meeting Effectiveness and Inclusiveness in Remote Collaboration", In Repository of arXiv:2102.09803v1, Feb. 19, 2021, 31 Pages.

Domanovitz, et al., "An Explicit Rate-Optimal Streaming Code for Channels with Burst and Arbitrary Erasures", In Proceedings of IEEE Information Theory Workshop (ITW), Aug. 25, 2019, 24 Pages.

Dudzicz, et al., "An Explicit Construction of Optimal Streaming Codes for Channels with Burst and Arbitrary Erasures", In Journal of IEEE Transactions on Communications, vol. 68, No. 1, Jan. 2020, 22 Pages.

Elliott, et al., "Estimates of Error Rates for Codes on Burst-Noise Channels", In Journal of the Bell System Technical Journal, vol. 42, No. 5, Sep. 1963, pp. 1977-1997.

Emara, et al., "Low-Latency Network-Adaptive Error Control for Interactive Streaming", In Journal of IEEE Transactions on Multimedia, Mar. 31, 2021, pp. 1-16.

Fong, et al., "Optimal Multiplexed Erasure Codes for Streaming Messages with Different Decoding Delays", In Journal of IEEE Transactions on Information Theory, vol. 66, No. 7, Jul. 2020, pp. 4007-4018.

Fong, et al., "Optimal Streaming Codes for Channels with Burst and Arbitrary Erasures", In Journal of IEEE Transactions on Information Theory, vol. 65, No. 7, Jul. 2019, pp. 4274-4292.

Friedman, et al., "RTP Control Protocol Extended Reports (RTCP XR)", Retrieved From: https://www.hjp.at/doc/rfc/rfc3611.html, Nov. 2003, 56 Pages.

García, et al., "Understanding and Estimating Quality of Experience in Webrtc Applications", In Paper of Computing, vol. 101, Oct. 1, 2018, pp. 1585-1607.

Gettys, "Bufferbloat: Dark Buffers in the Internet", In Journal of IEEE Internet Computing, vol. 15, Issue 3, May 2011, pp. 95-96.

Haghifam, et al., "Streaming Codes with unequal error Protection against Burst Losses", In Proceedings of 29th Biennial Symposium on Communications (BSC), Jun. 6, 2018, 5 Pages.

Holmer, et al., "Handling Packet Loss in WebRTC", In Proceedings of IEEE International Conference on Image Processing, Sep. 15, 2013, pp. 1860-1864.

Krishnan, et al., "A Quadratic Field-Size Rate-Optimal Streaming Code for Channels with Burst and Random Erasures", In Proceedings of IEEE International Symposium on Information Theory (ISIT), Jul. 7, 2019, pp. 852-856.

Krishnan, et al., "Rate-Optimal Streaming Codes for Channels with Burst and Isolated Erasures", In Proceedings of IEEE International Symposium on Information Theory (ISIT), Jun. 17, 2018, pp. 1809-1813.

Leong, et al., "Erasure Coding for Real-Time Streaming", In Proceedings of IEEE International Symposium on Information Theory Proceedings, Jul. 1, 2012, pp. 289-293.

Leong, et al., "On Coding for Realtime Streaming Under Packet Erasures", In Proceedings of IEEE International Symposium on Information Theory, Jul. 7, 2013, pp. 1012-1016.

Li, et al., "Correcting Erasure Bursts with Minimum Decoding Delay", In Proceedings of Record of the Forty Fifth Asilomar Conference on Signals, Systems and Computers (ASILOMAR), Nov. 6, 2011, pp. 33-39.

Li, et al., "Forward Error Protection for Low-Delay Packet Video", In Proceedings of 18th International Packet Video Workshop, Dec. 13, 2010, pp. 1-8.

Mackay, Davidj., "Fountain Codes", In IEE Proceedings-Communications, vol. 152, No. 6, Dec. 2005, pp. 1062-1068.

Martinian, et al., "Burst Erasure Correction Codes with Low Decoding Delay", In Journal of IEEE Transactions on Information Theory, vol. 50, Issue 10, Oct. 2004, pp. 2494-2502.

Martinian, et al., "Delay-Optimal Burst Erasure Code Construction", In Proceedings of IEEE International Symposium on Information Theory, Jun. 24, 2007, pp. 1006-1010.

Nagy, et al., "Congestion Control Using FEC for Conversational Multimedia Communication", In Proceedings of the 5th ACM Multimedia Systems Conference, Mar. 19, 2014, 12 Pages.

Orosz, et al., "A Case Study on Correlating Video QoS and QoE", In Proceedings of IEEE Network Operations and Management Symposium (NOMS), May 5, 2014, 5 Pages.

Perkins, et al., "A Survey of Packet Loss Recovery Techniques for Streaming Audio", In Journal of IEEE network, vol. 12, No. 5, Sep. 1998, pp. 40-48.

Rao, et al., "Analysis of the Effect of Qos on Video Conferencing Qoe", In Publication of 15th International Wireless Communications & Mobile Computing Conference (IWCMC), Jun. 24, 2019, pp. 1267-1272.

Reed, et al., "Polynomial Codes Over Certain Finite Fields", In Journal of the Society for Industrial and Applied Mathematics, vol. 8, Issue 2, Jun. 1960, pp. 300-304.

Roca, et al., "Simple Low-Density Parity Check (LDPC) Staircase Forward Error Correction (FEC) Scheme for FECFRAME", Retrieved From: https://hal.inria.fr/hal-00781906/file/rfc6816.pdf, Dec. 2012, 25 Pages.

Roca, et al., "Simple Reed-Solomon Forward Error Correction (FEC) Scheme for FECFRAME", Retrieved From: https://hal.inria.fr/hal-00799727/file/rfc6865.pdf, Feb. 2013, 24 Pages.

Rosenberg, et al., "An RTP Payload Format for Generic Forward Error Correction", Retrieved From: https://www.hjp.at/doc/rfc/rfc2733.html, Dec. 1999, 27 Pages.

Rudow, et al., "Online Versus Offline Rate in Streaming Codes for Variable-Size Messages", In Proceedings of IEEE International Symposium on Information Theory (ISIT), Jun. 21, 2020, pp. 509-514.

Rudow, et al., "Streaming Codes for Variable-Size Arrivals", In Proceedings of 56th Annual Allerton Conference on Communication, Control, and Computing (Allerton), Oct. 2, 2018, pp. 733-740.

Uberti, Justin, "WebRTC Forward Error Correction Requirements", Retrieved From: https://www.hjp.at/doc/rfc/rfc8854.html, Jan. 2021, 10 Pages.

(56) References Cited

OTHER PUBLICATIONS

Watson, et al., "Forward Error Correction (FEC) Framework", Retrieved From: https://www.hjp.at/doc/rfc/rfc6363.html, Oct. 2011, 43 Pages.

Watson, et al., "Raptor Forward Error Correction (FEC) Schemes for FECFRAME", Retrieved From: https://www.hjp.at/doc/rfc/rfc6681.html, Aug. 2012, 23 Pages.

Wei, et al., "On Prioritized Coding for Real-Time Streaming Under Packet Erasures", In Proceedings of 51st Annual Allerton Conference on Communication, Control, and Computing (Allerton), Oct. 2, 2013, pp. 327-334.

Yeo, et al., "CRAWDAD: A Community Resource for Archiving Wireless Data at Dartmouth", In Journal of ACM SIGCOMM Computer Communication Review, vol. 36, No. 2, Apr. 2006, pp. 21-22.

Zanaty, et al., "RTP Payload Format for Flexible Forward Error Correction (FEC)", Retrieved From: https://www.rfc-editor.org/rfc/pdfrfc/rfc8627.txt.pdf, Jul. 2019, 41 Pages.

Badr, et al., "Embedded MDS Codes for Multicast Streaming", In Proceedings of the IEEE International Symposium on Information Theory, Jun. 14, 2015, pp. 2276-2280.

Cohen, et al., "Adaptive Causal Network Coding with Feedback", In Repository of arXiv:1905.02870v2, Sep. 27, 2019, 16 Pages.

"International Search Report and Written Opinion Issued in PCT Application No. PCT/US22/028411", dated Aug. 11, 2022, 12 Pages.

\* cited by examiner

LOSS RECOVERY USING STREAMING CODES IN FORWARD ERROR CORRECTION

CROSS-REFERENCE TO RELATED APPLICATIONS

This application claims the benefit of U.S. Provisional Application No. 63/208,718, entitled Loss Recovery Using Streaming Codes in Forward Error Correction, filed Jun. 9, 2021, the disclosure of which is hereby incorporated herein by reference in its entirety.

BACKGROUND

Videoconferencing can be a tool for productivity in the current age of remote work. Providing a high quality of experience (QoE) for video calls is important, particularly because QoE can be directly related to the effectiveness of meetings. The quality for videoconferencing may depend on several performance indicators, such as bandwidth, packet loss, and latency.

Recovering lost packets can be a part of providing high QoE. There are at least two approaches to do so—retransmission and forward error correction (FEC). These methods can consume significant bandwidth, yet providing sufficient bandwidth for transmitting data may also be a factor in providing QoE. Consequently, there may be a trade-off between providing robustness to packet loss and bandwidth for transmitting data. Retransmission involves sending the minimal amount of redundant data possible, and should be preferred where possible. However, retransmission may be inappropriate for videoconferencing calls when the round trip time is prohibitively high. This can follow from the requirement to decode lost packets within a strict latency—e.g., preferably less than 150 ms—in order to meet the real-time playback requirement. In such scenarios, lost packets may be recovered within an acceptable latency by using FEC codes.

Among the most commonly used FEC codes are the so-called "block codes." The idea of block codes is to encode k data packets, <D[1] D[k]>, with an additional r parity packets into <D[1], ..., D[k], P[1], ..., P[r]>, such that the k data packets can be decoded using a subset of the (k+r) packets. For example, when r=1, the block code might consist of <D[1], ..., D[k], $\otimes_{i=1}^{k}$ D[i]>. Here, all k data packets can be decoded when any single packet is lost. More generally, when any k of the (k+r) packets are sufficient for decoding, the block code is termed as "maximally distance separable (MDS)." One of the most well-known examples of MDS codes is the Reed-Solomon (RS) block code. Depending on the application, more sophisticated FEC schemes might be employed, such as fountain (i.e., rateless) codes or two-dimensional block codes.

SUMMARY

The following presents a simplified summary of one or more aspects of the technology disclosed herein in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In several examples, computer implemented methods, devices, and tangible non-transitory computer-readable media for forward error correction (FEC) in video streaming are provided. In some examples, a sender device identifies, for each frame i of a plurality of frames of a video stream, a partition of a set of video data symbols D[i] into a first set of video data symbols U[i] and a second set of video data symbols V[i]. The sender generates, for each frame i, a set of one or more streaming FEC code parity symbols P[i] based on the symbols: V[i−τ] through V[i−1], U[i−τ], and the symbols D[i]. In such examples, τ is a function of a maximum tolerable latency of the video stream expressed as a whole number of frames. The sender encodes, for each frame i, packets carrying the symbols D[i], and P[i]. The sender then transmits each frame i of encoded packets in frame order to one or more receivers.

In some examples, the number of symbols in the first set U[i] is equal to the number of symbols in the second set V[i]. In some examples, τ is a maximum number of frames such that a time to encode τ consecutive frames plus a propagation delay is less than the maximum tolerable latency.

In some examples, the sender receives, from at least one receiver, at least one quality report including parameters including one or more of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of a nominal bandwidth overhead of the streaming FEC code. In such examples the sender selects, based on the quality report, a bandwidth overhead reduction from a nominal bandwidth overhead of the streaming FEC code for use in the generating for a period of time. In such examples, the generating includes generating the set of streaming FEC code parity symbols P[i] at a bandwidth overhead specified by the bandwidth overhead reduction. In some such examples, selecting a bandwidth overhead reduction includes selecting one bandwidth overhead reduction from a plurality of bandwidth overhead reductions including at least no reduction. In some such examples, the selecting includes applying, by the sender, a machine learning process using the parameters of at least one received quality report. In some such examples, the machine learning process is a neural network. In some such examples, the neural network is a binary classifier neural network. In some such examples, the neural network is a fully connected neural network with one hidden layer and applies a cross-entropy loss.

In some examples, the sender receives, from a receiver and prior to the generating, a bandwidth overhead reduction classification indicating one of a plurality of bandwidth overhead reductions from a nominal bandwidth overhead of the streaming FEC code, the plurality of bandwidth overhead reductions including at least no bandwidth overhead reduction. In such examples, the generating includes generating the set of streaming FEC code parity symbols P[i] at a bandwidth overhead specified by the received bandwidth overhead reduction classification. In some such examples, the bandwidth overhead reduction parameter was selected at the receiver using parameters including a plurality of: a fraction of packets lost across two or more consecutive frames where at least one packet is lost per frame, a fraction of instances in which one or more frames with packet loss are followed by at least t consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of the nominal bandwidth overhead of the streaming FEC code.

In some examples, a receiver receives, from a sender, a video stream including streaming forward error correction (FEC). The stream includes a plurality of at least r sequential frames. Each frame i includes data symbols D[1] consisting of a first set of video data symbols U[i] and a second set of video data symbols V[i]; and a set of one or more streaming FEC code parity symbols P[i] based on the symbols: V[i−τ] through V[i−1], U[i−τ], and the symbols D[i]. In such examples, τ is a function of a maximum tolerable latency of the video stream expressed as a whole number of frames. Upon a burst loss of symbols across b frames, each experiencing at least one packet loss, where b is an integer ranging from 1 to τ+1 including frame i through frame i+b−1, the receiver decodes lost symbols from among V[i], . . . , V[i+b−1] using one or more of properly received P[i], . . . , P[i+τ], and decodes lost symbols of U[j] for any integer j ranging from i to (i+b−1) using one or more of properly received P[j], . . . , P[j+τ].

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
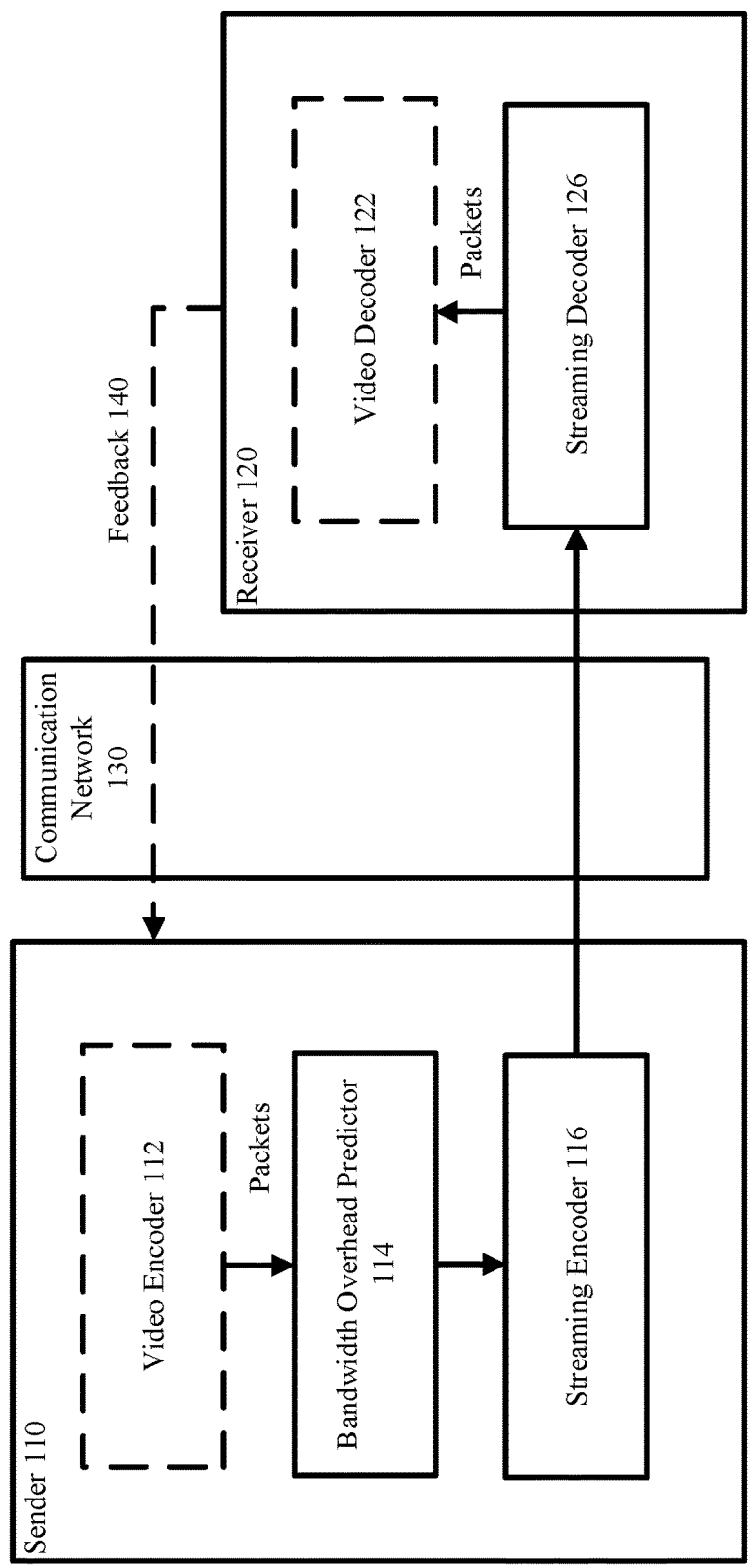
FIG. 1 is an illustration of examples of the present technology in a videoconferencing context.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known components are shown in block diagram form in order to avoid obscuring such concepts.

Both retransmission and standard FEC are inefficient at recovering bursts of packet losses in real time. A significant bandwidth overhead is needed to recover packet losses in real time, even using FEC. Such bandwidth overhead should be reduced to lessen the possibility of degrading the QoE.

Bursts of packet losses frequently arise. In one study, 38.4% of instances of packet loss occur as bursts across two or more consecutive video frames; and losses are frequently followed by a guard space of several frames that experience lossless transmission. Specifically, in a majority of the calls examined in the study, a guard space of at least three frames occurs after every instance of a burst of packet loss.

Bursts of packet losses across multiple frames followed by a sufficiently long guard space (e.g., three frames) can be recovered with significantly lower bandwidth overhead than that of established commonly-used FEC schemes, including RS codes. A relatively new class of theoretical FEC code constructions, known as "streaming codes," are specifically designed to decode such losses within the real-time latency constraints using less bandwidth overhead. Streaming codes can save bandwidth by sequentially decoding the frames lost in the burst using all admissible parity packets—not just those of the current frame. By contrast, conventional codes would decode those packets that it could by the playback deadline of the first lossy frame in the burst. This wastes later parity packets that could have been used to decode the other lost frames.

However, there are several obstacles that have so far limited practical adoption of streaming codes. First, streaming code constructions have so far been limited to theoretical models that are ill-suited to practical videoconferencing applications. Most work on streaming codes assumes that the sizes of input data (video frames) are fixed. Although this limitation has been addressed recently, the constructions are designed for transmitting only one packet per frame. As such, they cannot be applied directly for videoconferencing, where multiple packets are frequently sent for individual video frames. Second, the constructions are designed for an adversarial channel models that dictate that the bandwidth overhead must be high. Yet, such channel models are often overly pessimistic. Furthermore, one aspect of the channel model upon which streaming codes are built is that bursts of losses occur and are followed by guard spaces of receptions. Such loss patterns arise frequently, but there are also many instances of losses that do not occur in this manner. Third, streaming code constructions have not been evaluated using the packet loss patterns that arise in real-world videoconferencing applications, leaving their usefulness in practice unknown.

Traditionally, FEC is applied to packets, but videoconferencing involves transmitting multiple packets for each video frame. One solution is to combine all of the data packets for one or more frames together as part of a block code, such as an RS code or fountain code. The parity packets are then sent immediately after the final data packet in the block. A second approach is to encode the data packets for each frame as part of a block and also employ a block code across multiple frames. Both these approaches have significant limitations for bursty losses.

The approach of using a single block code across multiple frames has at least two drawbacks. First, even if a single packet is lost for the first frame in a block, it cannot be decoded until the parity packets are sent after the final frame in the block. Fewer frames might be included in the block to reduce this latency. However, the fewer the frames that are included in the block, the smaller the robustness to bursts of packet loss. For instance, only one frame might be used in the block. While this may mitigate the latency issue mentioned above, it is insufficient for recovering bursts of packet losses across multiple frames. Such losses are frequently followed by several frames for which no packet is lost. Yet the parity packets for frames immediately after the burst cannot be used to recover the burst under this approach. Second, packets sent in a short period of time may be lost if they are sent while a buffer router is full. If such a congestion were to arise coinciding with the final frame of a block, none of the lost packets would be recoverable. Finally, the approach of applying one block code within each frame and another block code across multiple frames can be used, but it incurs a significant bandwidth overhead.

Packet losses typically are bursty in nature. However, most of the block codes employed in videoconferencing applications are inefficient at recovering from bursty losses. This is due, in part, to them being optimized to recover from a different kind of loss pattern, namely adversarial or arbitrary losses.

Streaming FEC codes can meet the fundamental limits on bandwidth overhead for recovering from bursts of packet losses for real-time applications. The framework of streaming codes is well-suited for videoconferencing applications for at least the following reasons: it captures the streaming nature of incoming data via sequential encoding; it incorporates the per-frame decoding latency that can be tolerated for real-time playback via sequential decoding; and it optimizes for recovering bursty losses with minimal bandwidth overhead.

In sequential encoding, data packets and parity packets are sent for each video frame, and the parity packets are a function of the data packets from the current frame and previous frames that fall within a predefined window. Sequential encoding fits well into the setting of videoconferencing in which a sequence of a video frames are generated periodically (e.g., one every 33.3 ms for a 30 fps video). The symbols sent for $i^{th}$ video frame can be denoted as D[i], where each symbol can be thought of as a vector of bits. More formally, a symbol is an element of a mathematical entity called a finite field and all operations are performed over finite fields using modular arithmetic. For simplicity, the present disclosure is expressed in usual arithmetic without affecting meaning. These symbols are distributed over one or more packets to be sent to the receiver. The number of symbols can vary from frame to frame, since video frames are compressed prior to transmission, and the sizes of compressed video frames are variable. In addition, some number of parity symbols of frame i, denoted as P[i], are transmitted in one or more packets. These parity symbols are a function (in particular, linear combinations) of the data symbols of the past few video frames. When packets corresponding to earlier video frames are lost, the symbols of P[i] may be used to recover them in time to be played by the receiver.

Each video frame must be decoded within a strict latency for it be useful in playback. This latency requirement is modeled by imposing the requirement that each video frame i is decoded by the time the packets for frame (i+τ) are received. The parameter τ is chosen based on the frame rate so that the latency of decoding each frame is tolerable. For example, if the maximum tolerable latency is 150 ms, the one way propagation delay is 50 ms, and a frame is encoded every 33.3 ms, τ could be set to 3, i.e., (150−50)/33.3. The methodology employed by the framework of streaming codes to recover a burst loss encompassing b consecutive frames D[1], . . . , D[i+b−1], is to sequentially recover each frame D[1] within a delay of exactly τ additional frames. In other words, for each j∈{i, . . . , i+b−1}, D[j] is recovered using the symbols of P [i+b], . . . , P [j+τ]. One advantage of this approach in decoding is that it makes use of all parity symbols that are received by the playback deadline of the frames that experience lossy transmission. In contrast, the conventional approach of using block codes, such as RS codes, would necessarily have to decode all lost packets together. Hence, the recovery would have to be done by the time the first lost frame must be decoded, i.e., by the time the symbols of P[i+τ] are received. This wastes the parity symbols sent in P[i+τ+1], . . . , P [j+b−1+τ]. This is one difference due to which streaming codes can achieve significantly lower bandwidth overhead.

There are at least three obstacles to leveraging existing streaming codes for videoconferencing. First, streaming code constructions are designed for theoretical models, yet there is a significant gap between these models and videoconferencing applications. Second, the adversarial channel models used in the design of streaming codes are pessimistic, imposing stringent requirements on bandwidth overhead for streaming codes. Third, the benefits of streaming codes for videoconferencing have been primarily limited to theoretical works. Their effectiveness have not yet been assessed on largescale real-world traces. Whether they can provide substantive improvements in real-world systems has not been studied.

Until recently, theoretical underpinnings of streaming codes have been limited to models in which the sizes of frames are fixed and known in advance. Handling the variability in the sizes of video frames was one of the barriers to applying streaming codes to videoconferencing. The framework of streaming codes have only recently been generalized to handle variable sizes in the frames. Examples of the technology disclosed herein leverage this variable-size model in its design of streaming codes.

Despite handling variability in frame sizes, these constructions fall short of being ready for practical adoption. This is because, these constructions model all data corresponding to each frame as being sent in a single packet (which may be dropped). In practice, videoconferencing applications transmit video frames over multiple packets where the number of packets (and sizes of the packets) sent per frame can vary from frame to frame.

The methodology employed by existing theoretical streaming code constructions to select the bandwidth overhead is based on an adversarial loss model. This loss model allows bursts of up to b consecutive packet losses, for a parameter b, followed by guard spaces of consecutive packet receptions (e.g., all packets are received for consecutive frames). The number of packets sent per frame is fixed in these theoretical models, often as one. Thus, the parameter b directly relates to the number of consecutive frames for which all packets are lost. However, analysis of packet loss traces from production shows that only some of the packets might be lost for multiple consecutive frames. Designing a code construction to recover from all packets being lost for multiple consecutive frames is overly pessimistic and imposes a significant bandwidth penalty, negating the potential bandwidth savings of streaming codes. Examples of the technology disclosed hereon present different criteria for selecting the bandwidth overhead.

The benefits of streaming codes for videoconferencing have so far primarily been shown using simulated channels under theoretical models such as the Gilbert-Elliott channel. This has been a barrier to their practical adoption, since the relevance of these models to what is actually observed in practice for videoconferencing applications is not known. For instance, the greatest benefits from streaming codes arise when bursts occur across multiple frames and are followed by a guard space of several frames with no losses. Such losses occur in practice, and can be exploited via streaming code constructions designed for a realistic model of communication. Examples of the technology disclosed herein adapt a recently proposed theoretical construction for streaming codes to make it suitable for videoconferencing applications and employ a learning based approach to determine how much bandwidth to use for streaming codes.

As mentioned above, packet losses that are amenable to applying streaming codes to reduce the bandwidth overhead often arise in practice, and the bandwidth overhead cannot always be reduced via streaming codes due to the (albeit less frequent) presence of losses that are ill-suited for streaming codes. Thus, while one analysis of real-world packet loss traces from commercial videoconferencing calls shows that streaming codes are promising, realizing their potential for videoconferencing depends on overcoming some challenges. For example, there is a gap between the theoretical models employed by streaming codes and practical videoconferencing settings, and methodology employed by existing theoretical streaming code constructions to select the bandwidth overhead is ill-suited for the packet losses observed in real-world setting.

Examples of the technology disclosed herein addresses the above challenges in part by adapting a recently proposed theoretical construction of streaming codes to fit well for videoconferencing, and integrating it with a machine learning model to take a predictive decision on bandwidth allocated to streaming codes.

Turning now to FIG. 1-FIG. 13, examples are depicted with reference to one or more components and one or more methods that may perform the actions or operations described herein. Although the operations described below in are presented in a particular order and/or as being performed by an example component, the ordering of the actions and the components performing the actions may be varied, in some examples, depending on the implementation.

Moreover, in some examples, one or more of the actions, functions, and/or described components may be performed by a specially-programmed processor, a processor executing specially-programmed software or computer-readable media, or by any other combination of a hardware component and/or a software component capable of performing the described actions or functions.

Referring to FIG. 1, an illustration of examples of the present technology 100 in a videoconferencing context is shown. Sender 110 is in communication with receiver 120 over communication network 130. Each of sender 110 and receiver 120 can be a communication device such as an Internet-connected server, a notebook computer, a desktop computer, or a mobile phone. The role of one device versus another is relative and can change over the course of time, and can be concurrent. For example, each Internet-connected computer of each of four participants in a video teleconference can each concurrently be a sender and a receiver in the context of FIG. 1. Sender 110 and receiver 120 are in communication over communication network 130, including one or more of the Internet, a wide area network (WAN), a personal area network (PAN), a virtual private network (VPN), and other such communication networks known for use in teleconferencing.

In examples of the technology disclosed herein, video encoder 112 at the sender 110 encodes video data into packets. Bandwidth overhead (BWO) predictor 114 then determines the bandwidth overhead allotted to error correction. BWO predictor 114 uses feedback 140, e.g., in the form of a quality report including one or more real-valued metrics of packets loss, which can be added to the feedback already being sent by the typical videoconferencing receiver. In some examples as described below, BWO predictor 114 executes on one or more receivers 120, and feedback 140 is an indication of the BWO that the sender 110 should employ for error correction. While the data flow from video encoder 112 to BWO predictor 114 to streaming encoder 116 is shown as linear for simplicity of explanation, the actual flow can be different. The streaming encoder 116, is used to encode the data into data packets as well as parity packets. The streaming decoder 126 in the receiver 120 uses the parity packets to recover lost data packets, in addition to decoding the stream transport protocol to supply packets to the video decoder 122.

Figure 2:
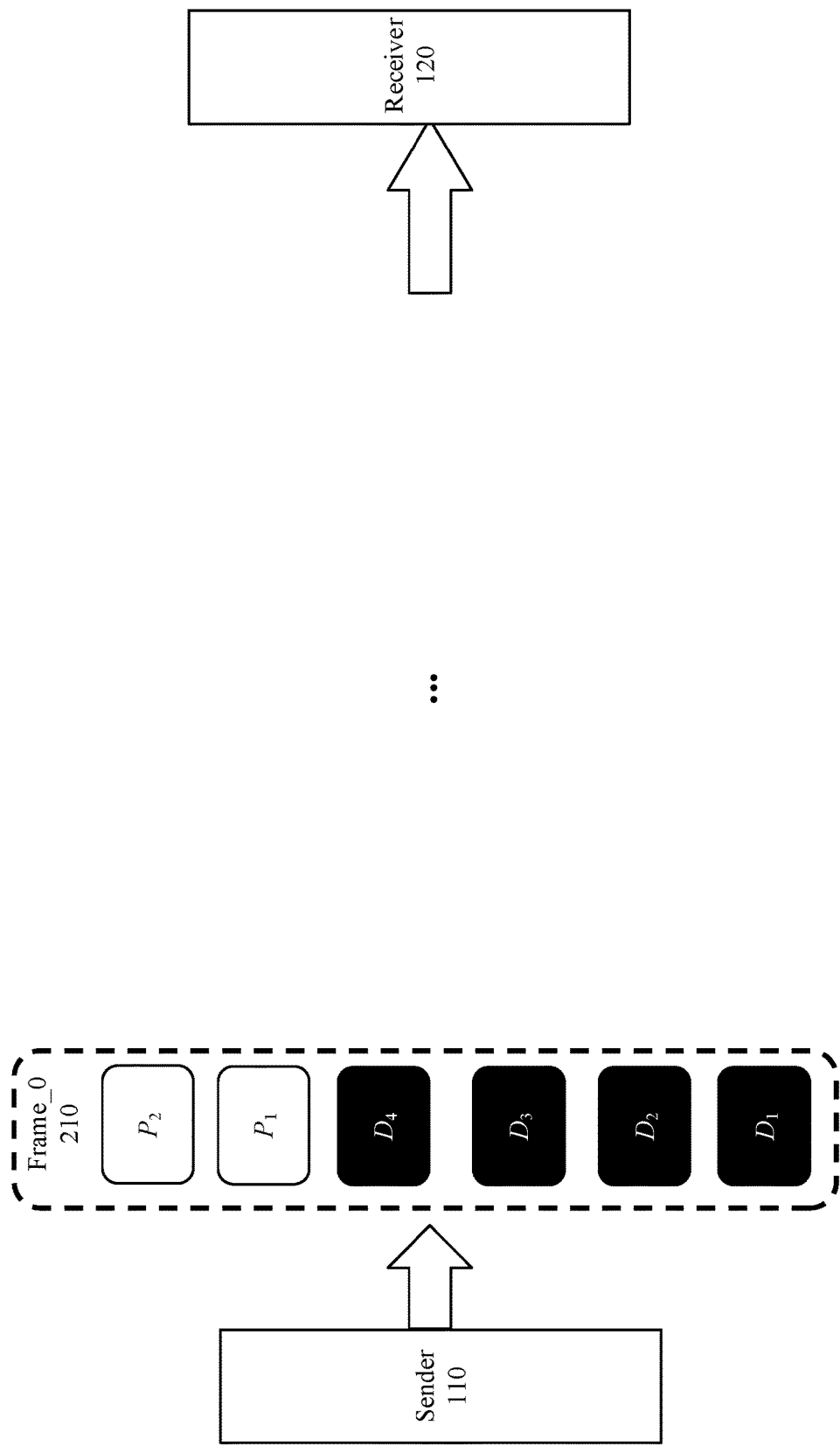
FIG. 2 is an illustration of a frame from a sender to a receiver, in accordance with examples of the technology disclosed herein.

Referring to FIG. 2, and continuing to refer to FIG. 1 for context, diagram 200 illustrating a frame, e.g., frame_0 210, from sender 110 to receiver 120 is shown, in accordance with examples of the technology disclosed herein. Frame_0 210 includes both data packets $D_{1-4}[0]$ and parity packets $P_{1-2}[0]$.

Figure 3:
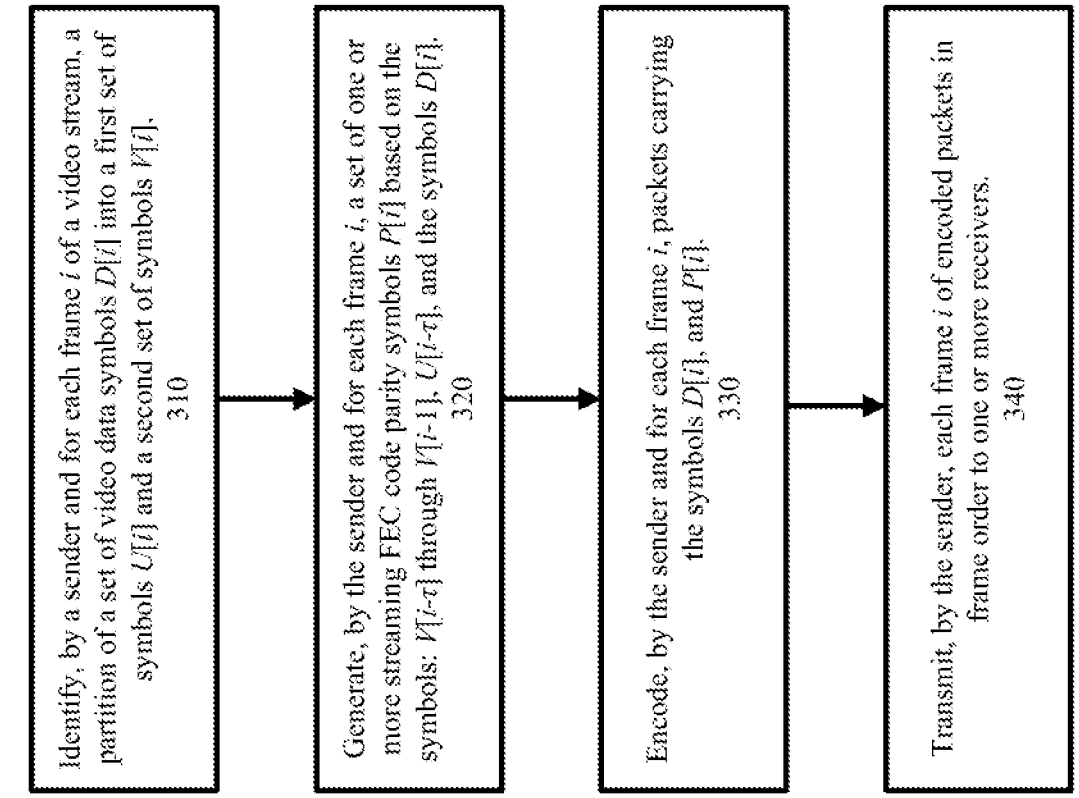
FIG. 3 is a flow diagram of an example method for forward error correction from the perspective of a sender, in accordance with examples of the technology disclosed herein.

Referring to FIG. 3, and continuing to refer to prior figures for context, example methods 300 for forward error correction are shown, from the perspective of a sender, in accordance with the technology disclosed herein. In such methods, a sender identifies, for each frame i of a plurality of frames of a video stream, a partition of a set of video data symbols D[i] into a first set of video data symbols U[i] and a second set of video data symbols V[i]—Block 310.

In a continuing example, the symbols D[i] for each video frame i are evenly partitioned into two parts: U[i] and V[i], shown in later figures. The distinction between the labels U[i] and V[i] relates to creating the parity symbols P[i] at the sender 110 and to recovering losses at the receiver 120; and not to encoding or transmission of D[i]. FIG. 2 shows frame_0 210 including $D_1[0]$–$D_4[0]$.

The decision, in the continuing example, to allocate the symbols of D[i] evenly between U[i] and V[i] is based on the maximum bandwidth overhead employed by typical videoconferencing applications. In such settings, U[i] is set equal in size to P[i], so that the linear combinations in P[i] are sufficient to recover U[i]. This allows for decoding of U[i] with minimal latency when occasional losses arise. It also helps in decoding U[i] when P[i+τ] is small. A large size for U[i] is desirable for recovering from longer bursts, as it defers the decoding of more symbols until the parity symbols for frame (i+τ) are received. Hence, the size of U[i] is maximized without exceeding the size of P[i]. In other examples, the partition of D[1] into U[i] and V[i] is uneven, and U[i] constitutes a different fraction between 0 and 1 of the symbols of D[i] and V[i] consists of the remaining symbols In some examples, sender 110 is a device such as device 1300 described below, and FEC component 1312 of device 1300 provides means for identifying, for each frame i of a plurality of frames of a video stream, a partition of a set of video data symbols D[i] into a first set of video data symbols U[i] and a second set of video data symbols V[i].

The sender generates, for each frame i, a set of one or more streaming FEC code parity symbols P[i] based on the symbols: V[i−τ] through V[i−1], U[i−τ], and the symbols D[i]—Block 320. In such examples, τ is a function of a maximum tolerable latency of the video stream expressed as a whole number of frames.

In the continuing example, parity symbols within P[i] are evenly be distributed over all parity packets $P_x[i]$ sent for the frame. The number of parity symbols is determined per known procedures for streaming FEC. The parity symbols are defined to be a function (the sum the continuing example) of three quantities: P[i]:=P1[i]+P2[i]+P3[i]. The symbols of P1[i] are a function (linear combinations in the continuing example) of the symbols of V[i−τ], . . . , V[i−1] (per streaming FEC). The symbols of P2[i] are a function (linear combinations in the continuing example) of the symbols of U[i−τ]. The symbols of P3[i] are a function (linear combinations in the continuing example) of the symbols of D[i]. The linear combinations for each of the three quantities are linearly independent linear equations in accordance with known streaming FEC codes. The encoding imposes a memory requirement of maintaining the (τ+1) most recent compressed video frames. In some examples, wherein τ is a maximum number of frames such that a time to encode τ consecutive frames plus a propagation delay is less than the maximum tolerable latency. For the first τ frames of a transmission, examples of the present technology use max(0, i−τ), . . . , max(0, i−1) rather than (i−τ, i−1).

The maximum tolerable decoding latency is taken to be 150 ms, which is a fairly standard value for interactive video such as videoconferencing. The frame rate is 30 fps. The approach generalizes to other frame rates as well. The streaming codes construction parameter t is set to equal 3. This ensures that the total latency to decode a lost frame is at most 100=3×33.3 ms, leaving room for an additional 50 ms latency for other sources, such as the one-way propagation delay.

In some examples, sender 110 is a device such as device 1300 described below, and FEC component 1312 of device 1300 provides means for generating, for each frame i, a set of one or more streaming FEC code parity symbols P[i] based on the symbols: V[i−τ] through V[i−1], U[i−−τ], and the symbols D[i].

The sender encodes, for each frame i, packets carrying the symbols D[i], and P[i]—Block 330. In the continuing example, sender 110 encodes $D_1[0]$-$D_4[0]$ and $P_1[0]$-$P_2[0]$ to form Frame_0 210. In some examples, sender 110 is a device such as device 1300 described below, and FEC component 1312 of device 1300 provides means for encoding, for each frame i, packets carrying the symbols D[i], and P[i].

The sender transmits each frame i of encoded packets in frame order to one or more receivers—Block 340. In the continuing example, sender 110 transmits Frame_0 210 to the receiver 120. In some examples, sender 110 is a device such as device 1300 described below, and FEC component 1312 of device 1300 provides means for transmits each frame i of encoded packets in frame order to one or more receivers.

Figure 4:
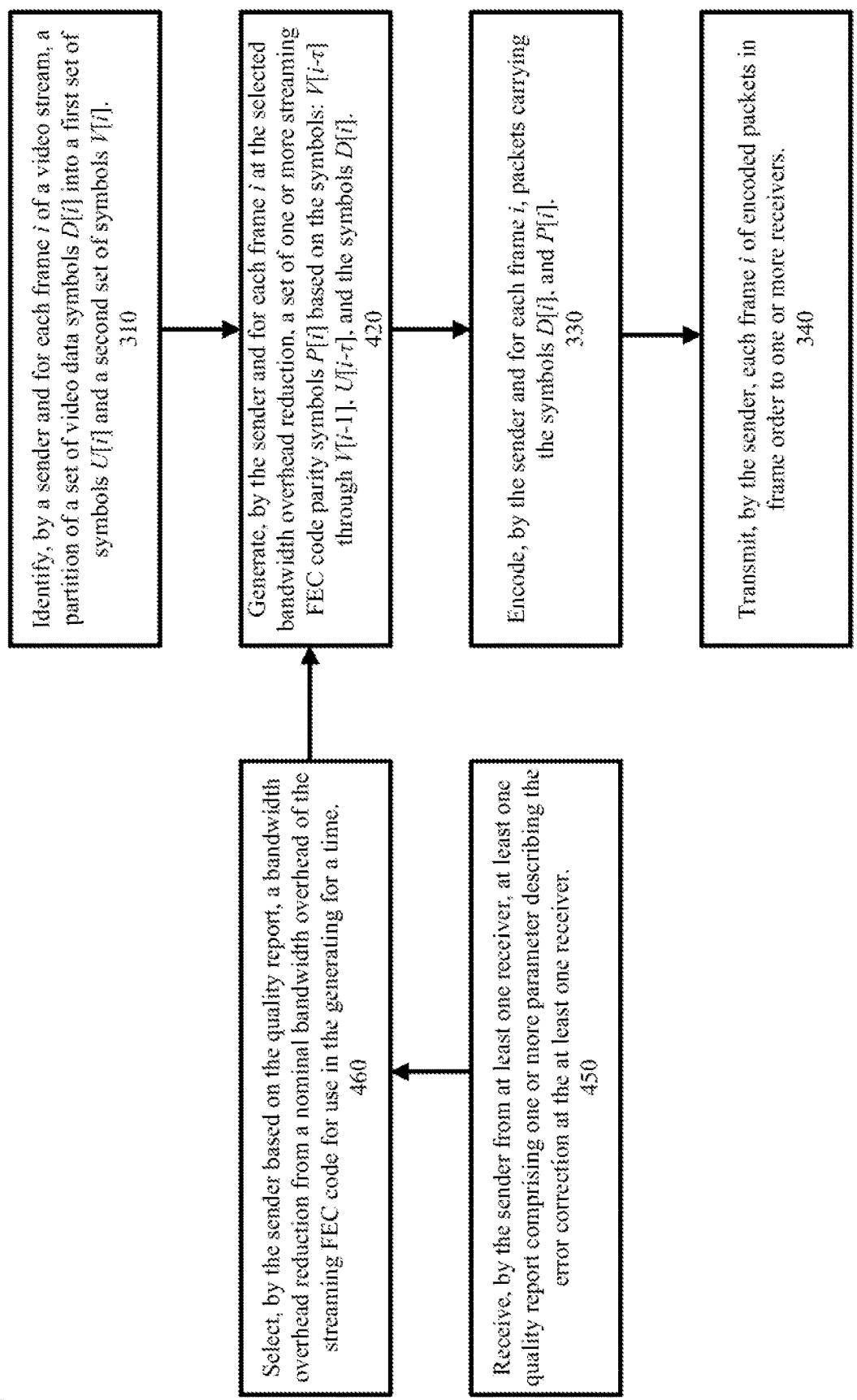
FIG. 4 is a flow diagram of an example method for forward error correction from the perspective of a sender, in accordance with examples of the technology disclosed herein.

Referring to FIG. 4, and continuing to refer to prior figures for context, example methods 400 for forward error correction are shown, from the perspective of a sender, in accordance with the technology disclosed herein. In such methods, Block 310, Block 330, and Block 340 are performed as described above in connection with FIG. 3. Further in such methods, the sender receives, from at least one receiver prior to the generating, at least one quality report comprising one or more parameters describing the error correction at the at least one receiver—Block 450. The one or more parameters include: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of a nominal bandwidth overhead of the streaming FEC code.

As part of the continuing example, let P, different from P[i], be a bitmap of packet losses since the last quality report. Similarly, let F be a bitmap over all frames since the last quality report where the value for a frame is "1" if at least one packet associated with the frame is lost, and "0" otherwise. In such examples, the quality report includes all thirteen parameters identified above, each of which can be computed in linear time with a single sequential pass over F and P.

In some examples, sender 110 is a device such as device 1300 described below, and FEC component 1312 of device 1300 provides means for receiving, from at least one receiver prior to the generating, at least one quality report comprising one or more parameters describing the error correction at the at least one receiver.

The sender selects, based on the quality report, a bandwidth overhead reduction from a nominal bandwidth overhead of the streaming FEC code for use in the generating for a period of time—Block 460. In the continuing example, a nominal bandwidth overhead of the streaming FEC code is the starting point for the bandwidth overhead (in general, this could be the bandwidth overhead of the FEC scheme employed by the underlying application logic). A machine learning classification model is used for determining the amount of bandwidth overhead reduction possible via streaming codes. Specifically in the continuing example, a small neural network is used that outputs two options for the bandwidth overhead: (a) leave it unchanged, or (b) reduce it by 50%. The reason for these specific values in the continuing example is that they are the maximum and minimum settings for the bandwidth overhead reduction expected to be reasonable. In the study mentioned above, in 95% of instances the bandwidth can be reduced by 50% without incurring decoding failures. Reducing the bandwidth by less than 50% on the remaining 5% of instances would not have a tangible impact on the bandwidth overhead. Thus, the continuing example employs binary classification rather than multiclass classification for reducing the bandwidth overhead. This approach can be easily generalized to multiple values for bandwidth using a multiclass classifier instead.

The neural network of the continuing example employs different weights with the two classes based on prioritization of bandwidth savings versus minimizing decoding failures for video frames. The higher the weight for the class corresponding to not reducing the bandwidth overhead the greater the fraction video frames which are decoded but the lower the reduction in bandwidth overhead. Videoconferencing service operators can use these weights as a knob to prioritize reducing decoding failures or reducing the bandwidth overhead.

In the continuing example, multi-class classification is employed to determine the bandwidth overhead relative to that of commercial videoconferencing application. To train this classifier, an oracle was used with access to three classes: Baseline employed by the commercial videoconferencing application, the continuing example's FEC streaming code with the same bandwidth overhead as Baseline, and the continuing example's FEC streaming code with 50% of the bandwidth overhead as Baseline.

The continuing example was restricted to not increase the sizes of any parity packets due to evaluating over traces of the commercial videoconferencing application. Furthermore, given an objective of decreasing the bandwidth overhead via streaming codes, the continuing example does not increasing the bandwidth overhead. During training, the three coding schemes were used 0.68%, 4.41%, and 94.9% of the time respectively. Selecting Baseline rarely decodes more frames and mistakenly doing so frequently leads to decoding failures, so it was eliminated as a choice. In the continuing example, reducing bandwidth overhead for the streaming code by less than 50% is necessary only for at most 4.41% instances. Partially reducing the bandwidth overhead in such scenarios would not significantly change the overall bandwidth overhead. Therefore, the continuing example does not add any more classes for reducing the bandwidth overhead (e.g., using 75% of the bandwidth) and instead uses binary classification.

Binary classification was conducted using a small fully connected neural network with one hidden layer. A various number of hidden neurons were tested and exhibited similar performance. The input to the neural network is the values of the thirteen parameters metrics for each of the previous three quality reports. The cross-entropy loss was applied, and by default, the weights are for not reducing the bandwidth overhead and reducing the bandwidth overhead by half are 0.999 and 0.001, respectively. The model as implemented and trained in PyTorch, and its inference time was negligible given its small size.

In some examples, sender 110 is a device such as device 1300 described below, and FEC component 1312 of device 1300 provides means for selecting, based on the quality report, a bandwidth overhead reduction from a nominal bandwidth overhead of the streaming FEC code for use in the generating for a period of time.

In the methods 400 of FIG. 4, the generating (described in conjunction with Block 320) comprises generating the set of streaming FEC code parity symbols P[i] at a bandwidth overhead specified by the bandwidth overhead reduction—Block 420.

Figure 5:
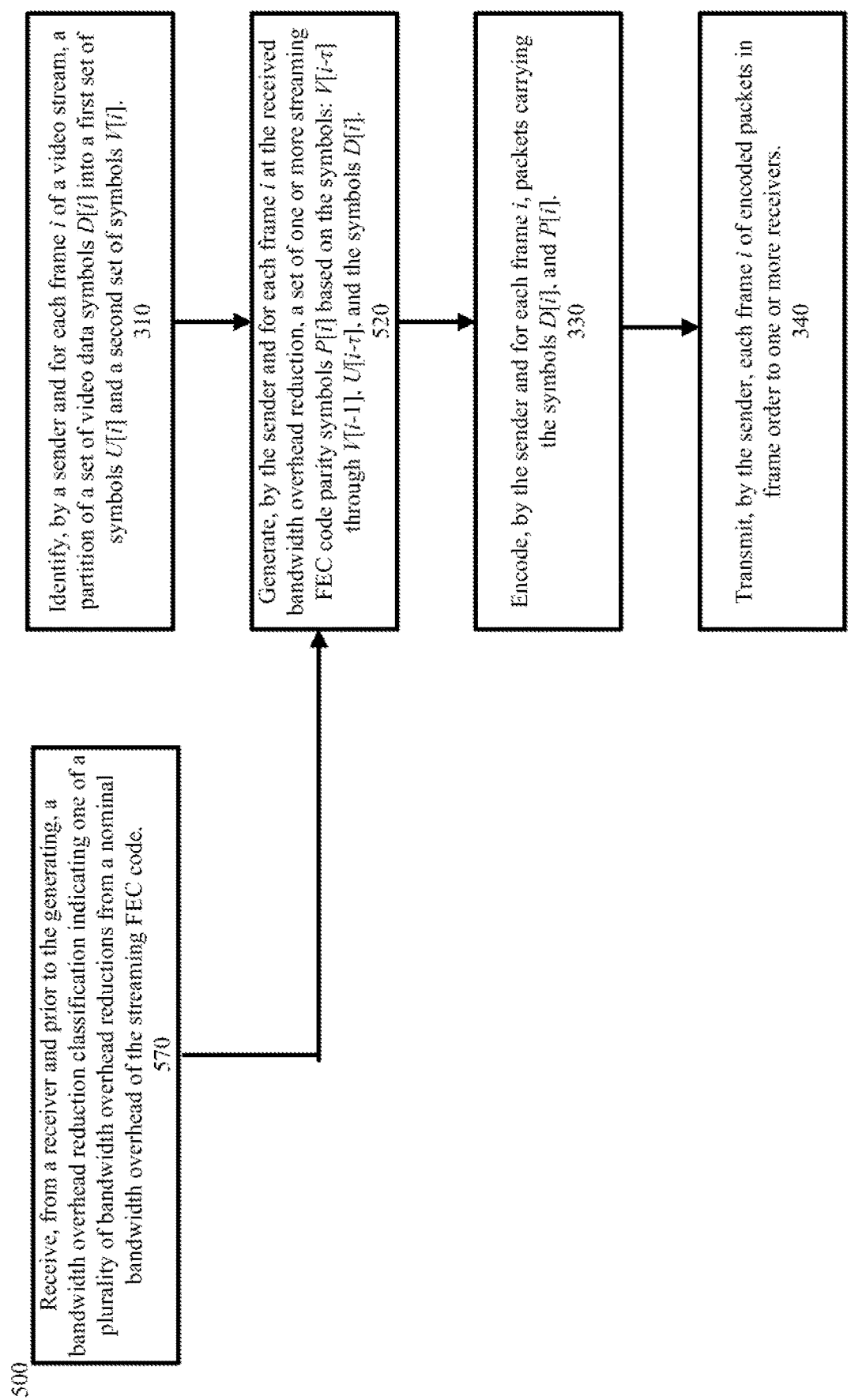
FIG. 5 is a flow diagram of an example method for forward error correction from the perspective of a sender, in accordance with examples of the technology disclosed herein.

Referring to FIG. 5, and continuing to refer to prior figures for context, example methods 500 for forward error correction are shown, from the perspective of a sender, in accordance with the technology disclosed herein. In such methods, Block 310, Block 330, and Block 340 are performed as described above in connection with FIG. 3. Further in such methods, the sender receives, from a receiver and prior to the generating, a bandwidth overhead reduction classification indicating one of a plurality of bandwidth overhead reductions from a nominal bandwidth overhead of the streaming FEC code—Block 570. In the continuing example, the plurality of bandwidth overhead reductions include at least no bandwidth overhead reduction. In some examples, the bandwidth overhead reduction was selected at the receiver using the parameters and machine learning methods as described above in connection with FIG. 4.

In some examples, sender 110 is a device such as device 1300 described below, and FEC component 1312 of device 1300 provides means for receiving, from a receiver and prior to the generating, a bandwidth overhead reduction classification indicating one of a plurality of bandwidth overhead reductions from a nominal bandwidth overhead of the streaming FEC code.

In the methods 500 of FIG. 5, the generating (described in conjunction with Block 320) comprises generating the set of streaming FEC code parity symbols P[i] at a bandwidth overhead specified by the bandwidth overhead reduction—Block 520.

Figure 6:
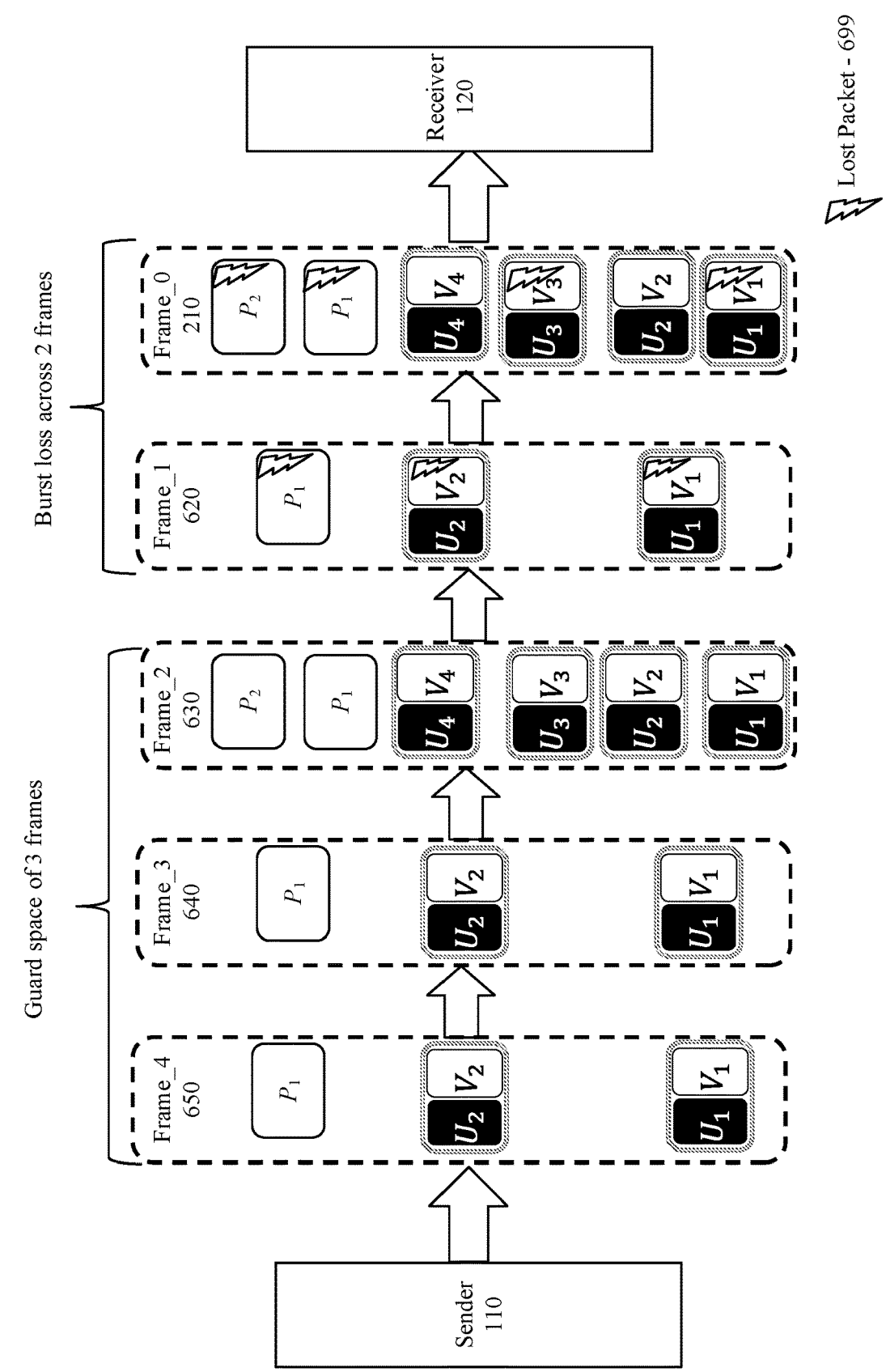
FIG. 6 is a frame diagram, in accordance with examples of the technology disclosed herein.

Referring to FIG. 6, and continuing to refer to prior figures for context, the method 300 of FIG. 3 has been executed five times, transmitting Frame_0 210 through Frame_4 650 from sender 110 to receiver 120. A burst of losses, indicated by the lost packet symbol 699, has occurred across Frame_0 210 and Frame_1 620. Each $D_x[i]$ has been relabeled $U_x[i]$ and $V_x[i]$—though importantly, none of the content has changed other than through packet loss as indicated. The $U_x[i]$ and $V_x[i]$ notation is simply useful for the decoding explanation, as was the case for explaining the generation of parity symbols P[i]. A guard space of three frames with no losses has occurred across Frame_2 630 through Frame_4 650. The technology disclosed herein will recover the data of lost symbols V[i] in 0-to-$\tau$ frames or less than the frame i of the loss, and will recover lost symbol U[i] in either the $i^{th}$ frame (the frame of the loss) or $\tau$ frames from the loss.

Figure 7:
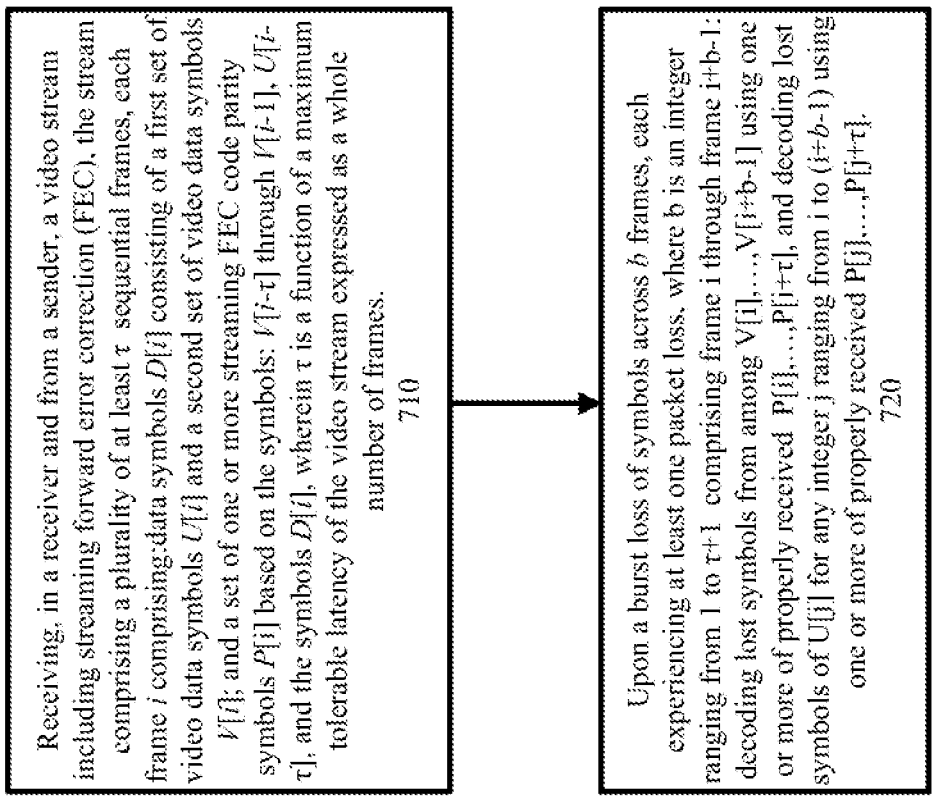
FIG. 7 is a flow diagram of an example method for forward error correction from the perspective of a sender, in accordance with examples of the technology disclosed herein.

Referring to FIG. 7, and continuing to refer to prior figures for context, example methods 700 for forward error correction are shown, from the perspective of a receiver, in accordance with the technology disclosed herein. In such methods, a receiver receives, from a sender, a video stream including streaming forward error correction (FEC), the stream comprising a plurality of sequential frames—Block 710. Each frame i includes: (1) data symbols D[i] consisting of a first set of video data symbols U[i] and a second set of video data symbols V[i]; and (2) a set of one or more streaming FEC code parity symbols P[i] based on the symbols: V[i−$\tau$] through V[i−1], U[i−$\tau$], and the symbols D[i]. As above, $\tau$ is a function of a maximum tolerable latency of the video stream expressed as a whole number of frames. In the continuing example, Frame_0 210 through Frame_3 640 are received as indicated. The role and effect of Frame_4 650 is discussed later.

In some examples, receiver 120 is a device such as device 1300 described below, and FEC component 1312 of device 1300 provides means for receiving, from a sender, a video stream including streaming forward error correction (FEC), the stream comprising a plurality of sequential frames.

Upon a burst loss of symbols across b frames, each experiencing at least one packet loss, the receiver decodes lost symbols from among V[i], . . . , V[i+b−1] using one or more of properly received P[i], . . . , P [i+τ], and decodes lost symbols of U [j] for any integer j ranging from i to (i+b−1) using one or more of properly received P[j], . . . , P [j+τ]—Block 720. In such methods, b is an integer ranging from 1 to (τ+1) comprising frame i through frame (i+b−1).

In the case of occasional packet loss, suppose that packet losses are rare and the size of P[i] exceeds the number of symbols lost for frame i. The symbols of P[i] are used to decode the $i^{th}$ video frame with negligible latency.

In the continuing example, Gaussian Elimination is used for decoding. A burst loss across frames i and (i+1) is encountered, as described above in connection with FIG. 6. The received symbols of P[i] as well as P[i+2], . . . , P[i+τ] are used to recover U[i], V[i], and V[i+1] with Gaussian Elimination, where U[i], V[i] together yield DN. Next, the symbols of P[i+1] and P[i+1+τ] are used in conjunction with P[i+2], . . . , P[i+τ] to decode U[i+1], which consists of all remaining symbols of D[i]. Each of D[i] and D[i+1] are decoded within τ additional frames (i.e., within the maximum tolerable latency).

In general, when a burst loss occurs across multiple frames, the symbols labeled V for all frames are decoded together by the playback deadline of the first lossy frame. In contrast, the symbols of each U[i] are decoded with a latency of τ frames. Hence, if a burst loss occurs across frames i and (i+1), U[i] is decoded within τ frames, while U[i+1] is decoded using the redundancy of one additional frame. For each of U[i] and V[i], the symbols are evenly distributed over all of the data packets sent for the frame. Loss recovery for a burst of b frames comprises a total of (τ+b) frames: b frames for the burst plus an additional τ frames for recovery. Examples of the technology disclosed herein can still be used if there are fewer than (τ+b) frames. It is likely to simply be less effective in such scenarios—though still an improvement over conventional approached. Typically (τ+b) is 2+ orders of magnitude less than the length of a video call (e.g. (τ+b)=5, 30 frames per second leads to the number of frames per minute being 360 times (τ+b)).

Figure 8:
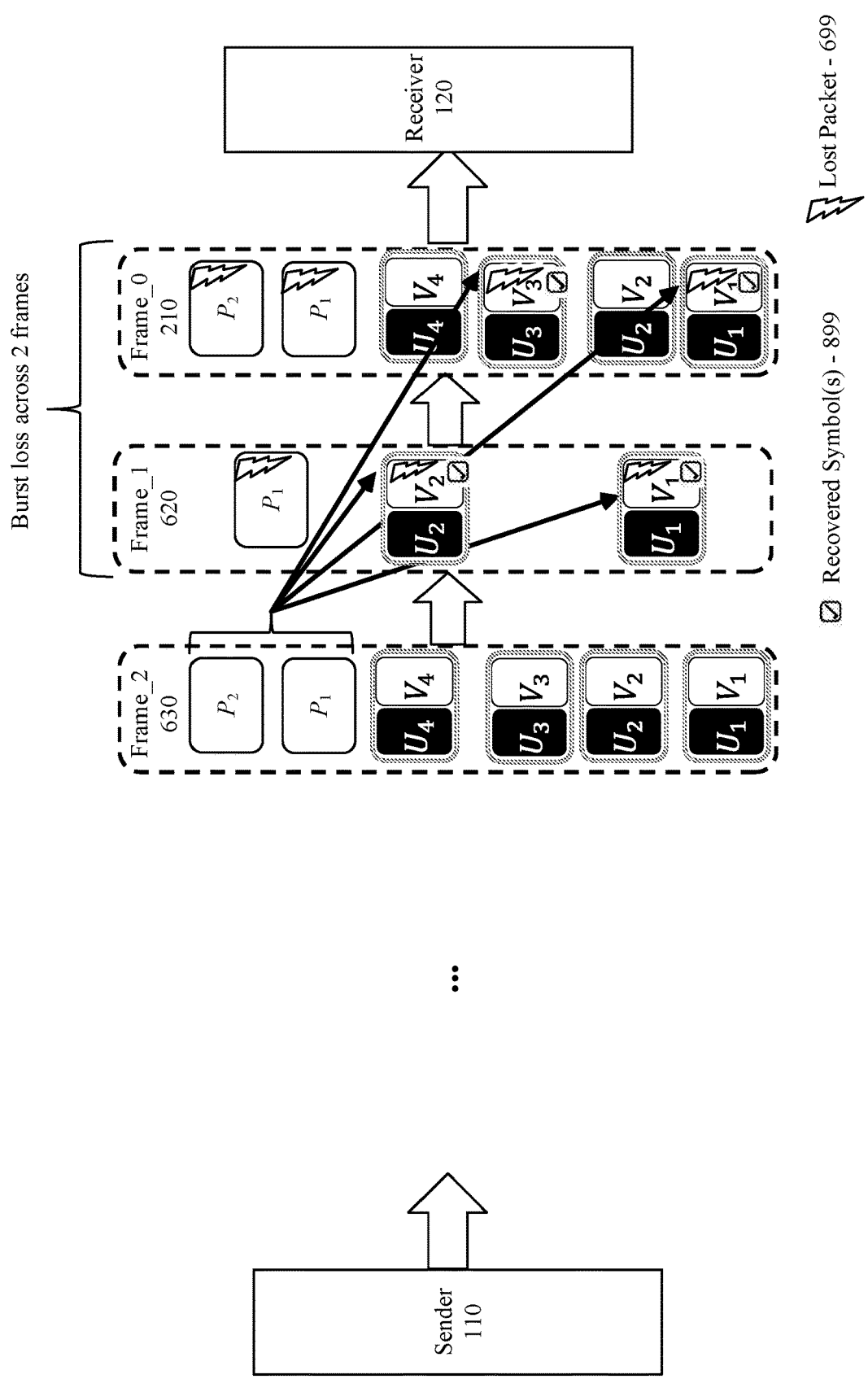
FIG. 8 is a frame diagram, in accordance with examples of the technology disclosed herein.

Referring to FIG. 8 and continuing to refer to prior figures for context, in the continuing example, the receiver 120 did not have properly-received parity information until Frame_2 630. So none of lost symbols $U_1[0]$, $V_1[0]$, $U_3[0]$, $V_3[0]$, $U_1[1]$, $V_1[1]$, $U_2[1]$, and $V_2[1]$ could be recovered before that time—though all Frame_0 210 and Frame_1 620 lost packets were still within the acceptable latency window τ=3 for recovery. After receiving Frame_2 630 containing the first properly received parity packets $P_1[2]$ and $P_2[2]$, the receiver 120 uses $P_1[2]$ and $P_2[2]$ to recover $V_1[0]$, $V_3[0]$, $V_1[1]$, $V_2[1]$—denoted by the recovery symbol checkbox 899. Lost symbols $U_1[0]$, $U_3[0]$, $U_1[1]$, and $U_2[1]$, may still be recovered within the first frames after their loss if timely parity information is properly received.

Figure 9:
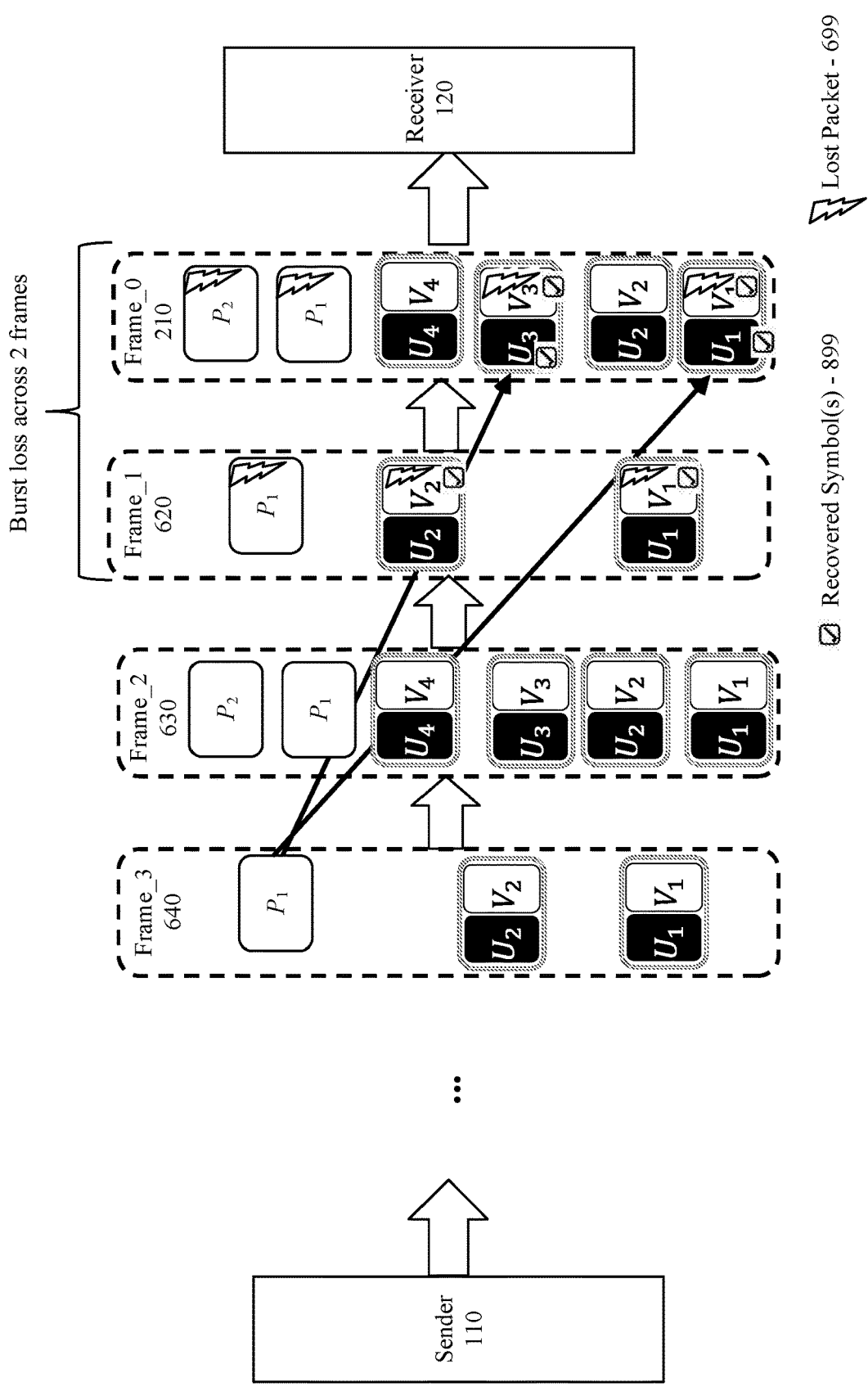
FIG. 9 is a frame diagram, in accordance with examples of the technology disclosed herein.

Referring to FIG. 9 and continuing to refer to prior figures for context, further in the continuing example, the receiver receives Frame_3 640. The receiver 120 uses $P_1[3]$ to recover $U_1[0]$ and $U_3[0]$ denoted by the recovered symbol checkbox 899—still within τ=3 frames of improperly receiving $D_1[0]$ and $D_3[0]$.

Figure 10:
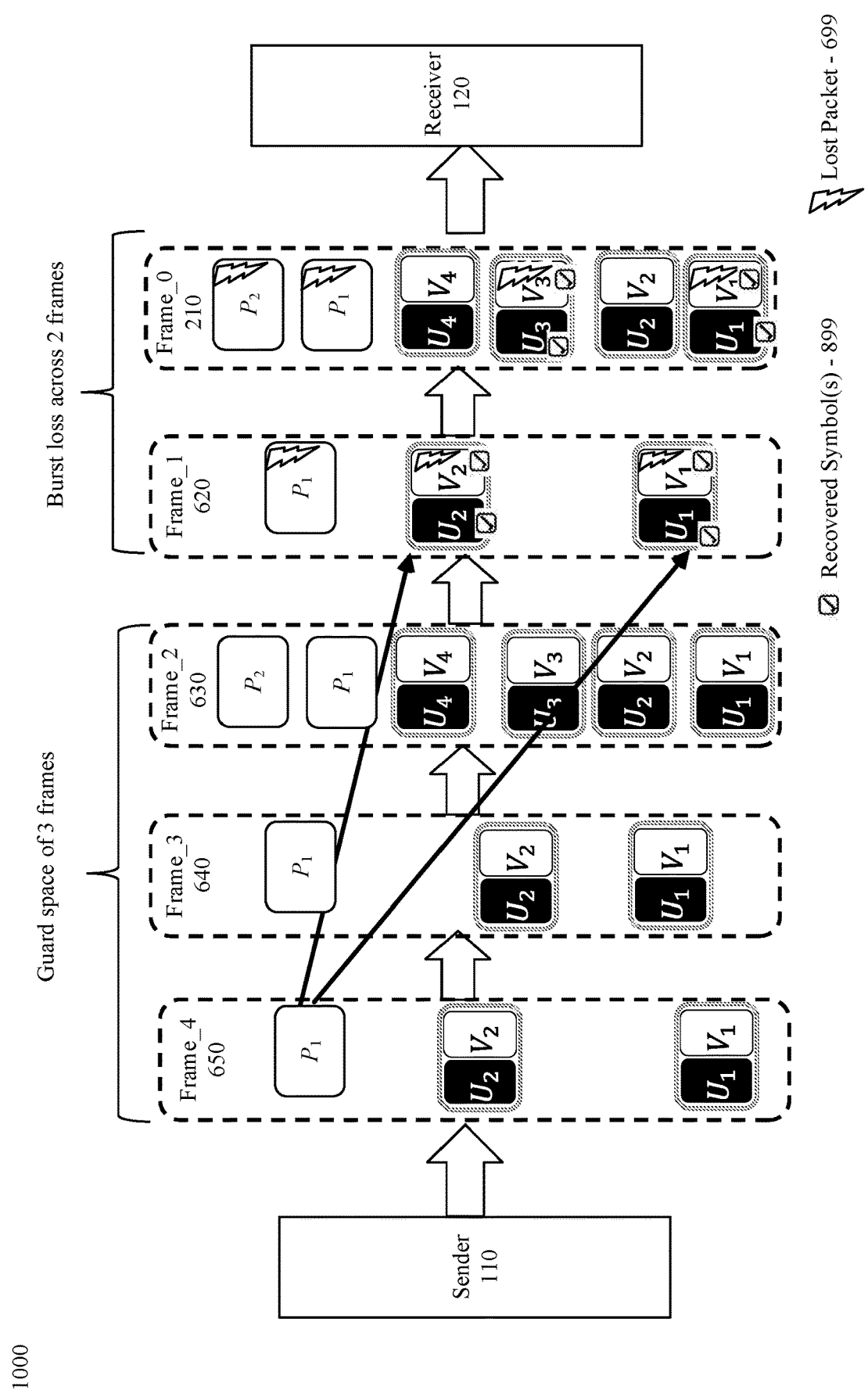
FIG. 10 is a frame diagram, in accordance with examples of the technology disclosed herein.

Referring to FIG. 10 and continuing to refer to prior figures for context, further in the continuing example, the receiver receives Frame_4 650. The receiver 120 uses P'[4] to recover $U_1[1]$ and $U_2[1]$ denoted by the recovered symbol checkbox 899—still within τ=3 frames of improperly receiving $U_1[1]$.

In some examples, receiver 120 is a device such as device 1300 described below, and FEC component 1312 of device 1300 provides means for receiving, from a sender, a video stream including streaming forward error correction (FEC), the stream comprising a plurality of sequential frames.

Figure 11:
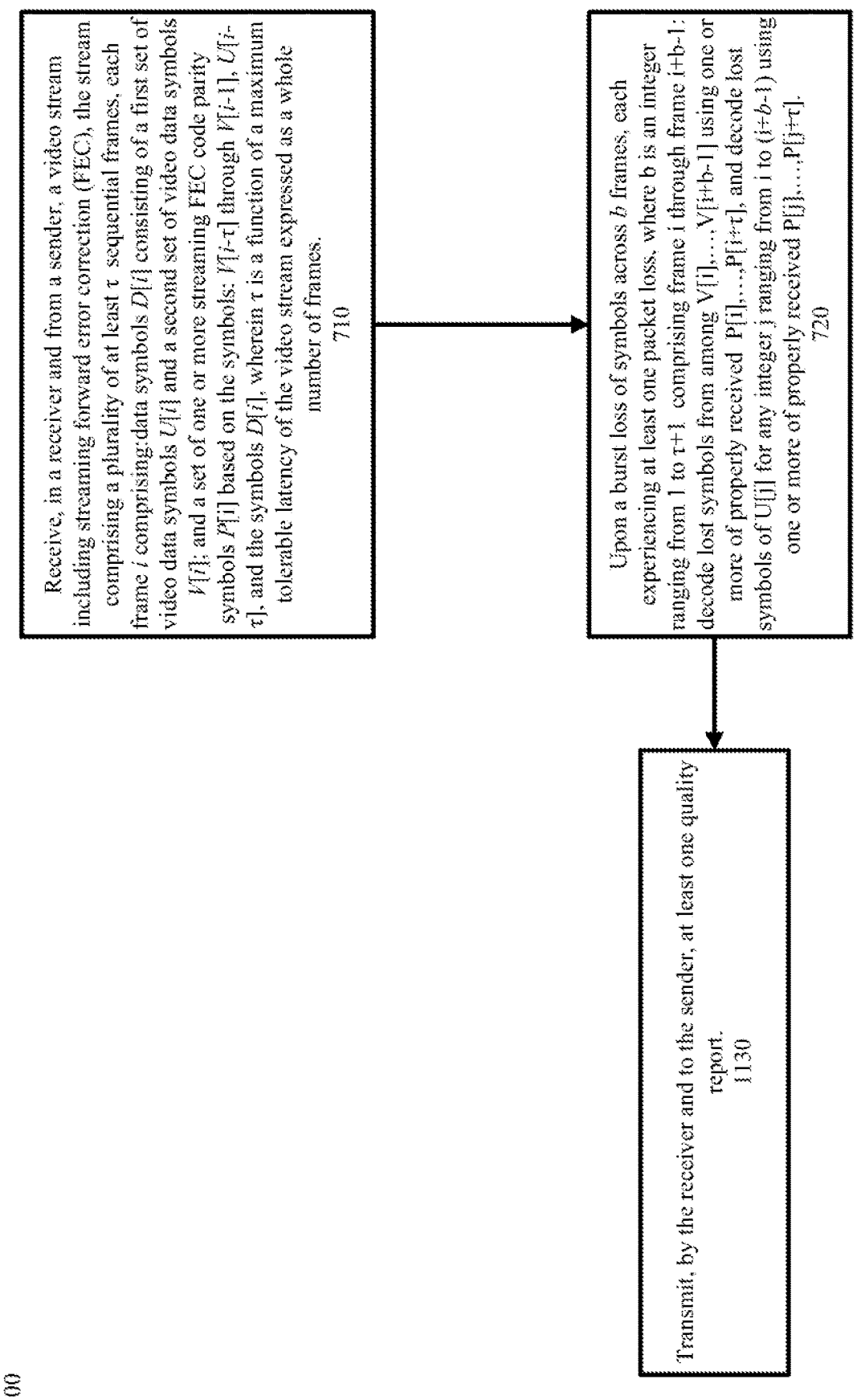
FIG. 11 is a flow diagram of an example method for forward error correction from the perspective of a sender, in accordance with examples of the technology disclosed herein.

Referring to FIG. 11, and continuing to refer to prior figures for context, example methods 1100 for forward error correction are shown, from the perspective of a receiver, in accordance with the technology disclosed herein. In such methods, Block 710 and 720 are performed as described in connection with FIG. 7. In such methods, the receiver transmits at least one quality report to the sender—Block 1130. In the continuing example, the quality report and its transmission are as described above in connection with FIG. 4. In some examples, receiver 120 is a device such as device 1300 described below, and FEC component 1312 of device 1300 provides means for transmitting at least one quality report to the sender.

Figure 12:
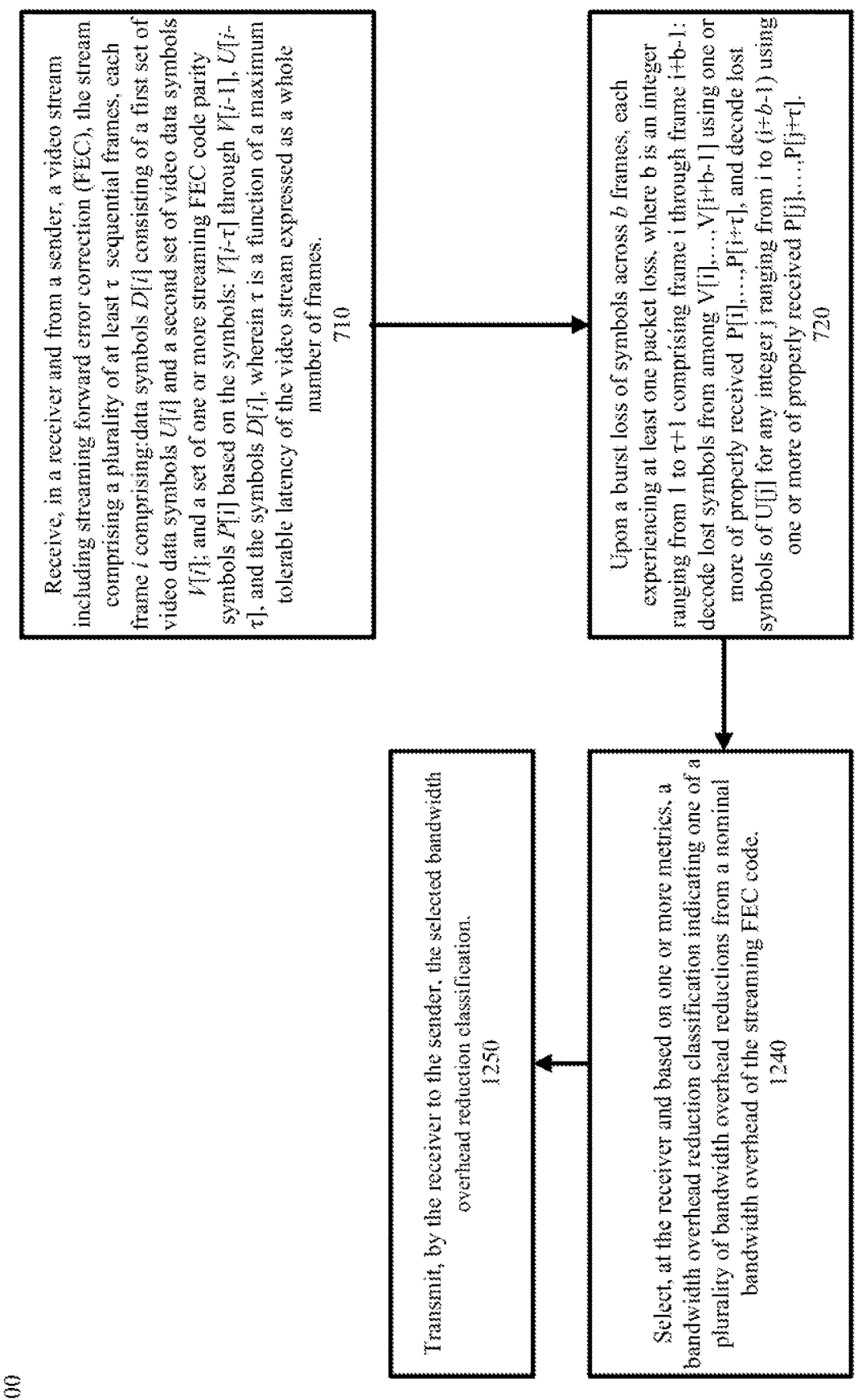
FIG. 12 is a flow diagram of an example method for forward error correction from the perspective of a sender, in accordance with examples of the technology disclosed herein.

Referring to FIG. 12, and continuing to refer to prior figures for context, example methods 1200 for forward error correction are shown, from the perspective of a receiver, in accordance with the technology disclosed herein. In such methods, Block 710 and 720 are performed as described in connection with FIG. 7. In such methods, the receiver selects, on one or more metrics, a bandwidth overhead reduction classification indicating one of a plurality of bandwidth overhead reductions from a nominal bandwidth overhead of the streaming FEC code—Block 1240. The plurality of bandwidth overhead reductions comprising at least no bandwidth overhead reduction. In the continuing example, selection of a bandwidth overhead reduction is as described above in connection with FIG. 4, including the use of machine learning applied by a neural network.

In some examples, receiver 120 is a device such as device 1300 described below, and FEC component 1312 of device 1300 provides means for selecting, on one or more metrics, a bandwidth overhead reduction classification indicating one of a plurality of bandwidth overhead reductions from a nominal bandwidth overhead of the streaming FEC code.

The receiver transmits, to the sender, the selected bandwidth overhead reduction classification—Block 1250. In the continuing example, transmission of the selected bandwidth overhead reduction is as described above in connection with FIG. 4, including the effect of such selection on future reception of the video stream by the receiver. In some examples, receiver 120 is a device such as device 1300 described below, and FEC component 1312 of device 1300 provides means for transmitting, to the sender, the selected bandwidth overhead reduction classification.

As an additional examples, consider a computer-implemented method for forward error correction (FEC) in video streaming. Such methods includes receiving, in a receiver and from a sender, a video stream including streaming forward error correction (FEC). The stream includes a plurality of sequential frames, each frame i comprising: data symbols D[i] consisting of a first set of video data symbols U[i] and a second set of video data symbols V[i], and a set of one or more streaming FEC code parity symbols P[i] based on the symbols: V[i−τ] through V[i−1], U[i−τ], and the symbols D[i]. In such examples, τ is a function of a maximum tolerable latency of the video stream expressed as a whole number of frames. Upon a burst loss across b frames, each experiencing at least one packet loss, where b is an integer ranging from 1 to τ+1 comprising frame i through frame i+b−1, the receiver decodes lost symbols from among V[i], . . . , V[i+b−1] using one or more of properly received P[i], . . . , P[i+τ]. The receiver further decodes lost symbols of U[j] for any integer j ranging from i to (i+b−1) using one or more of properly received P [j], . . . , P [j+τ].

In some such examples, each decoding comprises Gaussian Elimination. In some such examples, the number of symbols in the first set U[i] is equal to the number of symbols in the second set V[i]. In some such examples, τ is a maximum number of frames such that a time to encode τ consecutive frames plus a propagation delay is less than the maximum tolerable latency. In some such examples, the method further includes transmitting, by the receiver and to the sender, at least one quality report comprising parameters including one or more of: a fraction of packets lost across two or more consecutive frames where at least one packet is lost per frame, a fraction of instances in which one or more frames with packet loss are followed by at least consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of a nominal bandwidth overhead of the streaming FEC code. In such examples, the receiving at a time subsequent to the transmitting includes receiving the video stream from the sender at a bandwidth overhead reduction based on the transmitted quality report.

In some such examples, transmitting, by the receiver to the sender, a bandwidth overhead reduction classification indicating one of a plurality of bandwidth overhead reductions from a nominal bandwidth overhead of the streaming FEC code, the plurality of bandwidth overhead reductions includes at least no bandwidth overhead reduction. In some such examples, prior to the transmitting the receiver selects the bandwidth overhead reduction classification based on parameters including a one or more of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of the nominal bandwidth overhead of the streaming FEC code. In such examples transmitting the bandwidth overhead reduction classification comprises transmitting the selected bandwidth overhead reduction classification.

In some examples, selecting includes applying, by the receiver, a machine learning process using the parameters. In some examples, the machine learning process is a neural network. In some examples, the neural network is a binary classifier neural network. In some examples, the neural network is a fully connected neural network with one hidden layer and applies a cross-entropy loss.

In yet additional examples, a sender device for forward error correction (FEC) in video streaming includes a memory and at least one processor coupled to the memory. The memory including instructions executable by the at least one processor to cause the device to: identify, by the sender and for each frame i of a plurality of frames of a video stream, a partition of a set of video data symbols D[i] into a first set of video data symbols U[i] and a second set of video data symbols V[i]; generate, by the sender and for each frame i, a set of one or more streaming FEC code parity symbols P[i] based on the symbols: V[i−τ] through V[i−1], U[i−τ], and the symbols D[i], wherein τ is a function of a maximum tolerable latency of the video stream expressed as a whole number of frames; encode, by the sender and for each frame i, packets carrying the symbols D[i], and P[i]; and transmit, by the sender, each frame i of encoded packets in frame order to one or more receivers. In some such examples, In some such examples, the selecting includes applying, by the sender, a machine learning process using the parameters of at least one received quality report. In some such examples, the machine learning process is a neural network. In some such examples, the neural network is a binary classifier neural network. In some such examples, the neural network is a fully connected neural network with one hidden layer and applies a cross-entropy loss.

In some such examples, the memory further includes instructions executable by the at least one processor to cause the device to receive, by the sender from a receiver and prior to the generating, a bandwidth overhead reduction classification indicating one of a plurality of bandwidth overhead reductions from a nominal bandwidth overhead of the streaming FEC code, the plurality of bandwidth overhead reductions including at least no bandwidth overhead reduction. In such examples, generating includes generating the set of streaming FEC code parity symbols P[i] at a bandwidth overhead specified by the received bandwidth overhead reduction classification. In some such examples, the bandwidth overhead reduction classification was selected at the receiver using parameters including a plurality of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of the nominal bandwidth overhead of the streaming FEC code.

In a fourth set of examples, a receiver device for forward error correction (FEC) in video streaming, includes a memory; and at least one processor coupled to the memory. The memory includes instructions executable by the at least one processor to cause the device to: receive, in a receiver and from a sender, a video stream including streaming forward error correction (FEC), the stream comprising a plurality of sequential frames, each frame i comprising: data symbols D[i] consisting of a first set of video data symbols U[i] and a second set of video data symbols V[i], and a set of one or more streaming FEC code parity symbols P[i] based on the symbols: V[i−τ] through V[i−1], U[i−τ], and the symbols D[i], wherein τ is a function of a maximum tolerable latency of the video stream expressed as a whole number of frames; and upon a burst loss across b frames, each experiencing at least one packet loss, where b is an integer ranging from 1 to τ+1 comprising frame i through frame i+b−1: decode lost symbols from among V[i], . . . , V[i+b−1] using one or more of properly received P[i], . . . , P [i+τ], and decode lost symbols of U[j] for any integer j ranging from i to (i+b−1) using one or more of properly received P[j], . . . , P[j+τ].

In some examples, each decoding comprises Gaussian Elimination. In some examples, the number of symbols in the first set U[i] is equal to the number of symbols in the second set V[i]. In some examples, τ is a maximum number of frames such that a time to encode τ consecutive frames plus a propagation delay is less than the maximum tolerable latency. In some examples, the memory further includes instructions executable by the at least one processor to cause the device to: transmit, by the receiver and to the sender, at least one quality report comprising parameters including one or more of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of a nominal bandwidth overhead of the streaming FEC code. In such examples, the receiving at a time subsequent to the transmitting includes receiving the video stream from the sender at a bandwidth overhead reduction based on the transmitted quality report.

In some examples, the memory further includes instructions executable by the at least one processor to cause the device to: transmit, by the receiver to the sender, a bandwidth overhead reduction classification indicating one of a plurality of bandwidth overhead reductions from a nominal bandwidth overhead of the streaming FEC code, the plurality of bandwidth overhead reductions comprising at least no bandwidth overhead reduction. In some examples, the memory further includes instructions executable by the at least one processor to cause the device to, prior to the transmitting: select, at the receiver, the bandwidth overhead reduction classification based on parameters including a one or more of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of the nominal bandwidth overhead of the streaming FEC code. In such examples, transmitting the bandwidth overhead reduction classification comprises transmitting the selected bandwidth overhead reduction classification.

In some examples, selecting includes applying, by the receiver, a machine learning process using the parameters. In some examples, the machine learning process is a neural network. In some examples, the neural network is a binary classifier neural network. In some examples, the neural network is a fully connected neural network with one hidden layer and applies a cross-entropy loss.

In a fifth set of examples, a computer-readable medium stores computer executable code. The code, when executed by a processor of a sender device, causes the sender device to: identify, for each frame i of a plurality of frames of a video stream, a partition of a set of video data symbols D[i] into a first set of video data symbols U[i] and a second set of video data symbols V[i]; generate, for each frame i, a set of one or more streaming FEC code parity symbols P[i] based on the symbols: V[i−τ] through V[i−1], [i−τ], and the symbols D[i], wherein τ is a function of a maximum tolerable latency of the video stream expressed as a whole number of frames; encode, for each frame i, packets carrying the symbols D[i], and P[i]; and transmit each frame i of encoded packets in frame order to one or more receivers.

In some such examples, selecting a bandwidth overhead reduction includes selecting one bandwidth overhead reduction from a plurality of bandwidth overhead reductions comprising at least no reduction. In some such examples, selecting includes applying, by the sender, a machine learning process using the parameters of at least one received quality report. In some such examples, the machine learning process is a neural network. In some such examples, the neural network is a binary classifier neural network. In some such examples, the neural network is a fully connected neural network with one hidden layer and applies a cross-entropy loss.

In some such examples, the code, when executed by a processor of the sender device, further causes the sender device to: receive, by the sender from a receiver and prior to the generating, a bandwidth overhead reduction classification indicating one of a plurality of bandwidth overhead reductions from a nominal bandwidth overhead of the streaming FEC code, the plurality of bandwidth overhead reductions comprising at least no bandwidth overhead reduction. In such examples, generating includes generating the set of streaming FEC code parity symbols P[i] at a bandwidth overhead specified by the received bandwidth overhead reduction classification.

In some examples, the bandwidth overhead reduction classification was selected at the receiver using parameters including a plurality of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of the nominal bandwidth overhead of the streaming FEC code.

In a sixth set of examples, a computer-readable medium stores computer executable code. The code, when executed by a processor of a receiver device, causes the receiver device to: receive, from a sender, a video stream including streaming forward error correction (FEC), the stream comprising a plurality of sequential frames, each frame i including: data symbols D[i] consisting of a first set of video data symbols U[i] and a second set of video data symbols V[i], and a set of one or more streaming FEC code parity symbols P[i] based on the symbols: V[i−τ] through V[i−1], U[i−τ], and the symbols D[i], wherein τ is a function of a maximum tolerable latency of the video stream expressed as a whole number of frames; and upon a burst loss across b frames, each experiencing at least one packet loss, where b is an integer ranging from 1 to τ+1 comprising frame i through frame i+b−1: decode lost symbols from among V[i], . . . , V[i+b−1] using one or more of properly received P[i], . . . , P[i+τ], and decode lost symbols of U[j] for any integer j ranging from i to (i+b−1) using one or more of properly received P[j], . . . , P[j+τ].

In some examples, each decoding comprises Gaussian Elimination. In some examples, the number of symbols in the first set U[i] is equal to the number of symbols in the second set V[i]. In some examples, τ is a maximum number of frames such that a time to encode τ consecutive frames plus a propagation delay is less than the maximum tolerable latency.

In some examples, the code, when executed by a processor of the receiver device, further causes the sender device to: transmit, by the receiver and to the sender, at least one quality report comprising parameters including one or more of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of a nominal bandwidth overhead of the streaming FEC code, wherein the receiving at a time subsequent to the transmitting comprises receiving the video stream from the sender at a bandwidth overhead reduction based on the transmitted quality report.

In some examples, the code, when executed by a processor of the receiver device, further causes the sender device to: transmit, by the receiver to the sender, a bandwidth overhead reduction classification indicating one of a plurality of bandwidth overhead reductions from a nominal bandwidth overhead of the streaming FEC code, the plurality of bandwidth overhead reductions comprising at least no bandwidth overhead reduction.

In some examples, the code, when executed by a processor of the receiver device, further causes the sender device to, prior to the transmitting: select, at the receiver, the bandwidth overhead reduction classification based on parameters including a one or more of: a fraction of packets lost across two or more consecutive frames where at least one packet is lost per frame, a fraction of instances in which one or more frames with packet loss are followed by at least τ consecutive frames of lossless transmission, a fraction of packet losses, a fraction of frames with at least one packet loss, a mean number of consecutive packets lost, a mean number of consecutive frames with at least one packet lost, a mean number of consecutive packet receptions after a loss, a mean number of consecutive frame receptions without a loss after a loss, a burst density and a gap density for packets, a burst density and a gap density for frames, or a classification of the nominal bandwidth overhead of the streaming FEC code, herein transmitting the bandwidth overhead reduction classification comprises transmitting the selected bandwidth overhead reduction classification.

In some examples, the selecting includes applying, by the receiver, a machine learning process using the parameters. In some examples, the machine learning process is a neural network. In some examples, the neural network is a binary classifier neural network. In some examples, the neural network is a fully connected neural network with one hidden layer and applies a cross-entropy loss.

Figure 13:
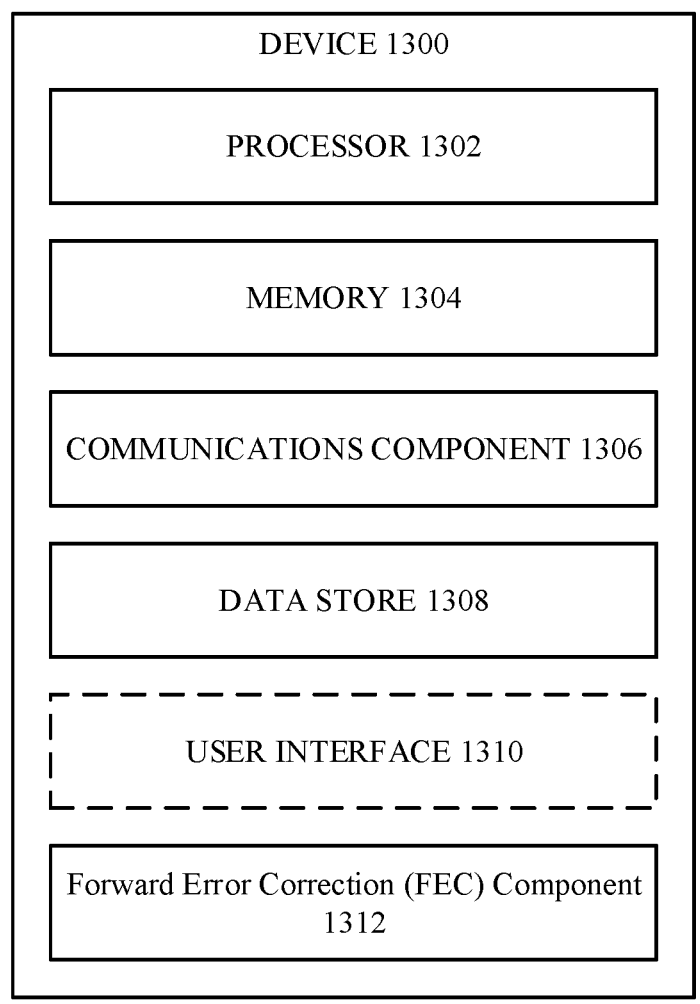
FIG. 13 is a schematic diagram of an example of a device for performing functions described herein.

FIG. 13 illustrates an example of device 1300. In one aspect, device 1300 may include processor 1302, which may be similar to processor 1302 for carrying out processing functions associated with one or more of components and functions described herein. Processor 1302 can include a single or multiple set of processors or multi-core processors. Moreover, processor 1302 can be implemented as an integrated processing system and/or a distributed processing system.

Device 1300 may further include memory 1304, such as for storing local versions of operating systems (or components thereof) and/or applications being executed by processor 1302, such as a streaming application/service 1312, etc., related instructions, parameters, etc. Memory 1304 can include a type of memory usable by a computer, such as random access memory (RAM), read only memory (ROM), tapes, magnetic discs, optical discs, volatile memory, non-volatile memory, and any combination thereof.

Further, device 1300 may include a communications component 1306 that provides for establishing and maintaining communications with one or more other devices, parties, entities, etc. utilizing hardware, software, and services as described herein. Communications component 1306 may carry communications between components on device 1300, as well as between device 1300 and external devices, such as devices located across a communications network and/or devices serially or locally connected to device 1300. For example, communications component 1306 may include one or more buses, and may further include transmit chain components and receive chain components associated with a wireless or wired transmitter and receiver, respectively, operable for interfacing with external devices.

Additionally, device 1300 may include a data store 1308, which can be any suitable combination of hardware and/or software, that provides for mass storage of information, databases, and programs employed in connection with aspects described herein. For example, data store 1308 may be or may include a data repository for operating systems (or components thereof), applications, related parameters, etc.) not currently being executed by processor 1302. In addition, data store 1308 may be a data repository for streaming application/service 1312 and/or one or more other components of the device 1300.

Device 1300 may optionally include a user interface component 1310 operable to receive inputs from a user of device 1300 and further operable to generate outputs for presentation to the user. User interface component 1310 may include one or more input devices, including but not limited to a keyboard, a number pad, a mouse, a touch-sensitive display, a navigation key, a function key, a microphone, a voice recognition component, a gesture recognition component, a depth sensor, a gaze tracking sensor, a switch/button, any other mechanism capable of receiving an input from a user, or any combination thereof. Further, user interface component 1310 may include one or more output devices, including but not limited to a display, a speaker, a haptic feedback mechanism, a printer, any other mechanism capable of presenting an output to a user, or any combination thereof. For example, user interface 1310 may render streaming content for consumption by a user (e.g., on a display of the device 1300, an audio output of the device 1300, and/or the like).

Device 1300 may additionally include an FEC component 1312, which may be similar to or may include streaming encoder 116 and bandwidth overhead predictor 114 in a sender 110; or streaming decoder 126 and a receiver version of bandwidth overhead predictor 114. In this regard, device 1300 may be operable to perform a role in loss recovery using streaming FEC, as described herein.

By way of example, an element, or any portion of an element, or any combination of elements may be implemented with a "processing system" that includes one or more processors. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software modules, applications, software applications, software packages, routines, subroutines, objects, executables, threads of execution, procedures, functions, etc., whether referred to as software, firmware, middleware, microcode, hardware description language, or otherwise.

Accordingly, in one or more aspects, one or more of the functions described may be implemented in hardware, software, firmware, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), and floppy disk where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described herein that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

We claim:

1. A computer implemented method for forward error correction (FEC) in video streaming, comprising:
   identifying, by a sender and for each frame i of a plurality of frames of a video stream, a partition of a set of video data symbols D[i] into a first set of video data symbols U[i] and a second set of video data symbols V[i];
   generating, by the sender and for each frame $i$, a set of one or more streaming FEC code parity symbols P[i] based on the symbols: V[i–$\tau$] through V[i–1], U[i–$\tau$], and the symbols D[i], wherein $\tau$ is a function of a maximum tolerable latency of the video stream expressed as a whole number of frames;
   encoding, by the sender and for each frame i, packets carrying the symbols D[i], and P[i]; and
   transmitting, by the sender, each frame i of encoded packets to one or more receivers.

2. The method of claim 1, wherein the number of symbols in the first set U[i] is equal to the number of symbols in the second set V[i].

3. The method of claim 1, wherein $\tau$ is a maximum number of frames such that a time to encode $\tau$ consecutive frames plus a propagation delay is less than the maximum tolerable latency.

4. The method of claim 1, further comprising:
   receiving, by the sender and from at least one receiver, at least one quality report comprising parameters including one or more of:
      a fraction of packets lost across two or more consecutive frames where at least one packet is lost per frame,
      a fraction of instances in which one or more frames with packet loss are followed by at least $\tau$ consecutive frames of lossless transmission,
      a fraction of packet losses,
      a fraction of frames with at least one packet loss,
      a mean number of consecutive packets lost,
      a mean number of consecutive frames with at least one packet lost,
      a mean number of consecutive packet receptions after a loss,
      a mean number of consecutive frame receptions without a loss after a loss,
      a burst density and a gap density for packets,
      a burst density and a gap density for frames, or
      a classification of a nominal bandwidth overhead of the streaming FEC code; and
   selecting, by the sender and based on the quality report, a bandwidth overhead reduction from a nominal bandwidth overhead of the streaming FEC code for use in the generating for a period of time,
   wherein the generating comprises generating the set of streaming FEC code parity symbols P[i] at a bandwidth overhead specified by the bandwidth overhead reduction.

5. The method of claim 4, wherein selecting a bandwidth overhead reduction comprises selecting one bandwidth overhead reduction from a plurality of bandwidth overhead reductions comprising at least no reduction.

6. The method of claim 4, wherein the selecting comprises applying, by the sender, a machine learning process using the parameters of at least one received quality report.

7. The method of claim 6, wherein the machine learning process is a neural network.

8. The method of claim 7, wherein the neural network is a binary classifier neural network.

9. The method of claim 8, wherein the neural network is a fully connected neural network with one hidden layer and applies a cross-entropy loss.

10. The method of claim 1, further comprising:
receiving, by the sender from a receiver and prior to the generating, a bandwidth overhead reduction classification indicating one of a plurality of bandwidth overhead reductions from a nominal bandwidth overhead of the streaming FEC code, the plurality of bandwidth overhead reductions comprising at least no bandwidth overhead reduction,
wherein the generating comprises generating the set of streaming FEC code parity symbols P[i] at a bandwidth overhead specified by the received bandwidth overhead reduction classification.

11. The method of claim 10, wherein the bandwidth overhead reduction classification was selected at the receiver using parameters including a plurality of:
a fraction of packets lost across two or more consecutive frames where at least one packet is lost per frame,
a fraction of instances in which one or more frames with packet loss are followed by at least $\tau$ consecutive frames of lossless transmission,
a fraction of packet losses,
a fraction of frames with at least one packet loss,
a mean number of consecutive packets lost,
a mean number of consecutive frames with at least one packet lost,
a mean number of consecutive packet receptions after a loss,
a mean number of consecutive frame receptions without a loss after a loss,
a burst density and a gap density for packets,
a burst density and a gap density for frames, or
a classification of the nominal bandwidth overhead of the streaming FEC code.

12. A sender device for forward error correction (FEC) in video streaming, comprising:
a memory; and
at least one processor coupled to the memory, the memory including instructions executable by the at least one processor to cause the device to:
identify, by the sender and for each frame i of a plurality of frames of a video stream, a partition of a set of video data symbols D[i] into a first set of video data symbols U[i] and a second set of video data symbols V[i];
generate, by the sender and for each frame i, a set of one or more streaming FEC code parity symbols P[i] based on the symbols: V[i−$\tau$] through V[i−1], [i−$\tau$], and the symbols D[i], wherein $\tau$ is a function of a maximum tolerable latency of the video stream expressed as a whole number of frames;
encode, by the sender and for each frame i, packets carrying the symbols D[i] and P[i]; and
transmit, by the sender, each frame i of encoded packets in frame order to one or more receivers.

13. The device of claim 12, wherein the number of symbols in the first set U[i] is equal to the number of symbols in the second set V[i].

14. The device of claim 12, wherein $\tau$ is a maximum number of frames such that a time to encode $\tau$ consecutive frames plus a propagation delay is less than the maximum tolerable latency.

15. The device of claim 12, wherein the memory further includes instructions executable by the at least one processor to cause the device to:
receive, by the sender and from at least one receiver, at least one quality report comprising parameters including one or more of:
a fraction of packets lost across two or more consecutive frames where at least one packet is lost per frame,
a fraction of instances in which one or more frames with packet loss are followed by at least $\tau$ consecutive frames of lossless transmission,
a fraction of packet losses,
a fraction of frames with at least one packet loss,
a mean number of consecutive packets lost,
a mean number of consecutive frames with at least one packet lost,
a mean number of consecutive packet receptions after a loss,
a mean number of consecutive frame receptions without a loss after a loss,
a burst density and a gap density for packets,
a burst density and a gap density for frames, or
a classification of a nominal bandwidth overhead of the streaming FEC code; and
select, by the sender and based on the quality report, a bandwidth overhead reduction from a nominal bandwidth overhead of the streaming FEC code for use in the generating for a period of time,
wherein the generating comprises generating the set of streaming FEC code parity symbols P[i] at a bandwidth overhead specified by the bandwidth overhead reduction.

16. The device of claim 15, wherein selecting a bandwidth overhead reduction comprises selecting one bandwidth overhead reduction from a plurality of bandwidth overhead reductions comprising at least no reduction.

17. A computer-implemented method for forward error correction (FEC) in video streaming, comprising:
receiving, in a receiver and from a sender, a video stream including streaming forward error correction (FEC), the stream comprising a plurality of sequential frames, each frame i comprising:
data symbols D[i] consisting of a first set of video data symbols U[i] and a second set of video data symbols V[i], and
a set of one or more streaming FEC code parity symbols P[i] based on the symbols: V[i−$\tau$] through V[i−1], U[i−$\tau$], and the symbols D[i], wherein $\tau$ is a function of a maximum tolerable latency of the video stream expressed as a whole number of frames; and
upon a burst loss across b frames, each experiencing at least one packet loss, where b is an integer ranging from 1 to $\tau$+1 comprising frame i through frame i+b−1;
decoding lost symbols from among V[i], . . . , V[i+b−1] using one or more of properly received P[i], . . . , P[i+$\tau$], and
decoding lost symbols of U[j] for any integer j ranging from i to (i+b−1) using one or more of properly received P [j], . . . , P[j+$\tau$].

18. The method of claim 17, wherein each decoding comprises Gaussian Elimination.

19. The method of claim 17, wherein the number of symbols in the first set U[i] is equal to the number of symbols in the second set V[i].

20. The method of claim 17, wherein $\tau$ is a maximum number of frames such that a time to encode $\tau$ consecutive frames plus a propagation delay is less than the maximum tolerable latency.

* * * * *

UNITED STATES PATENT AND TRADEMARK OFFICE
CERTIFICATE OF CORRECTION

| | |
|---|---|
| PATENT NO. | : 11,489,620 B1 |
| APPLICATION NO. | : 17/480917 |
| DATED | : November 1, 2022 |
| INVENTOR(S) | : Ananthanarayanan et al. |

It is certified that error appears in the above-identified patent and that said Letters Patent is hereby corrected as shown below:

On the Title Page

Item (72), listing the inventors, add:
-- Rashmi Korlakai VINAYAK, Pittsburgh, PA (US) --

In the Specification

Column 1, Line 13 before BACKGROUND and after CROSS REFERENCE TO RELATED APPLICATIONS, add the following:
-- STATEMENT REGARDING FEDERALLY SPONSORED RESEARCH OR DEVELOPMENT
This invention was made with United States government support under 1910813 awarded by the National Science Foundation. The U.S. government has certain rights in the invention. --

Signed and Sealed this
Twentieth Day of August, 2024

*Katherine Kelly Vidal*

Katherine Kelly Vidal
*Director of the United States Patent and Trademark Office*